(12) United States Patent
Nagata et al.

(10) Patent No.: US 6,407,417 B1
(45) Date of Patent: Jun. 18, 2002

(54) PHOTOELECTRIC CONVERSION DEVICE AND METHOD OF MANUFACTURING THE SAME

(75) Inventors: Tsuyoshi Nagata; Yasutaka Nakashiba, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/593,919

(22) Filed: Jun. 14, 2000

(30) Foreign Application Priority Data

Jun. 24, 1999 (JP) .......................... 11-179005

(51) Int. Cl.[7] ...................... H01L 31/062; H01L 31/113
(52) U.S. Cl. ...................... 257/292; 257/291; 257/461; 257/463
(58) Field of Search ................... 257/232, 233, 257/290, 291, 292, 461, 463

(56) References Cited

U.S. PATENT DOCUMENTS 5,962,882 A * 10/1999 Sin ........................... 257/222
6,271,553 B1 * 8/2001 Pan .......................... 257/291

* cited by examiner

Primary Examiner—Ngân V. Ngô
(74) Attorney, Agent, or Firm—Scully, Scott, Murphy & Presser

(57) ABSTRACT

In order to improve transistor characteristics (operating characteristics), separation characteristics between pixels, and high withstanding voltage characteristics, a photoelectric conversion device has a first conductive type well layer 12 provided on a semiconductor substrate 11 and a second conductive type light receiving region (photoelectric conversion region) 14 provided on the well layer 12. At a position under the light receiving region 14, there is provided a first conductive type impurity layer (depletion layer forming layer) 20 in which the impurity concentration thereof is set to be lower than that of the well layer 12 for enabling a reduction in the coupling capacitance, and a second conductive type impurity layer (reverse depletion layer forming layer) 17 in which the impurity concentration thereof is set to be lower than that of the light receiving region 14, such that at least a part thereof is located inside of the light receiving region 14, seen in plan view, for enabling extension of the depletion layer.

35 Claims, 14 Drawing Sheets

PHOTOELECTRIC CONVERSION DEVICE AND METHOD OF MANUFACTURING THE SAME

BACKGROUND OF THE INVENTION

1. Technical Field

The present invention relates to a photoelectric conversion device having a solid-state imaging device and a light receiving elements such as a photocoupler and a method of manufacturing the same, and, in particular, the present invention relates to techniques suitable for use in an active XY addressing type solid-state imaging devices among solid-state imaging devices (so-called CMOS sensors) compatible with the CMOS manufacturing process.

2. Background Art

Conventional solid state iamging device of a transfer layer method which transfer photoelectrically converted signal charges, are classified into MOS-type and CCD-type. These solid state imaging devices, in particular CCD-type solid state imaging devices, have been recently used for camera and VTR units, digital cameras, facsimile systems, etc., and technical development is now under way for improving the characteristics.

The CCD sensor is a type that has a photoelectric conversion portion in which photoelectric transducers corresponding to pixels are arranged in a two-dimensional array, and sequentially reads signals of each pixel which have been converted into electric charges by the photoeoelectric conversion portion, with a vertical transfer CCD and a horizontal transfer CCD.

The CMOS sensor does not use a CCD for vertical and horizontal transfer, and reads pixels selected by a selection line constituted by aluminum lines or the like, as with a memory device.

Here, the CCD sensor requires a plurality of positive and negative power supply potentials, while the CMOS sensor can be driven by a single power supply, enabling lower power consumption and lower voltage compared to the CCD sensor.

Moreover, since the CCD sensor uses a special process, it is difficult to directly apply the CMOS circuit manufacturing process thereto. On the other hand, the CMOS sensor uses the CMOS circuit manufacturing process. Hence it is possible to form a logic circuit, an analog circuit, an analog to digital conversion circuit or the like at the same time, by means of a CMOS process widely used in processors, semiconductor memories such as DRAMs, logic circuits, etc. That is, the CMOS sensor can be formed on a semiconductor chip the same as that for semiconductor memories and processors, and can share the production line with semiconductor memories and processors. One example of an image sensor which is such a CMOS sensor is shown in FIG. 13.

In FIG. 13, reference numeral 100 denotes an image sensor (CMOS sensor). This CMOS sensor 100 is provided with a timing generation portion 102, an image sensor portion 101, a vertical scanning portion 103 and a horizontal scanning portion 104 for selecting an output of a pixel, an analog signal processing portion 105, an A/D portion (A/D conversion portion) 109 for performing analog to digital conversion, a digital signal processing portion 107 for converting the digitalized signal into an output signal, and an interface portion (IF portion) 108 for outputting digital image data to the outside and receiving command data from the outside.

The image sensor portion 101 is an aggregate of basic cells of the CMOS sensor, as described later. The vertical scanning portion 103 is for controlling the vertical scanning of the basic cells in the image sensor portion 101, and the horizontal scanning portion 104 is for controlling the horizontal scanning of the basic cells in the image sensor portion 101. These portions perform respective scanning control with a timing signal output from the timing generation portion 101.

The analog signal processing portion 105 subjects the image signal read from the image sensor portion 101 to required processing and outputs the signal to the A/D conversion portion 109. The A/D conversion portion 109 then converts the image signal into a digital signal and outputs the signal to the digital signal processing portion 107, which in turn outputs the image signal to the interface portion 108.

The interface portion 108 can output to the outside the digital image data output via the digital signal processing portion 107, and can also input commands from the outside. As a result, the respective constituents are controlled so as to perform control corresponding to the received commands to enable control of the mode and the output signal form of the image sensor 100 and the signal output timing, corresponding to the commands.

Here, the A/D conversion portion 109, the digital signal processing portion 107, and the interface portion 108 constitute a logic circuit portion 106. Moreover, the digital signal processing portion 107 includes a memory portion. The memory portion may be constructed such that this stores image data for one or a plurality of lines, one or a plurality of blocks and one or a plurality of frames, required for the signal processing, with these being utilized for the signal processing in the digital signal processing portion 107.

Next, a conventional basic cell in the image sensor portion 101 of the CMOS sensor 100 is shown in FIG. 14A. In FIG. 14, reference numeral 10 denotes a basic cell (CMOS sensor), 11 denotes a p-type semiconductor substrate, 12 denotes a p-type well layer formed on the p-type semiconductor substrate, 14 denotes an n+ type region serving as a photodiode (photoelectric conversion region), 13 denotes a p+ type semiconductor region serving as a device separation region that separates the photoelectric conversion region 14 from an adjacent portion, 15 denotes an n+ type semiconductor region serving as a drain of a control MOSFET, 21 denotes the control MOSFET, 22 denotes a MOSFET of a source follower amplifier, 23 denotes a MOSFET of a horizontal selection switch, 24 denotes a load MOSFET of the source follower amplifier, 25 denotes a dark output transfer MOSFET, 26 denotes a light output transfer MOSFET, 27 denotes a dark output accumulation capacitance, and 28 denotes a light output accumulation capacitance.

In the p-type semiconductor substrate 11, as shown in FIG. 14, the photoelectric conversion region 14 is connected to a gate of the MOSFET 22 constituting the source follower amplifier via a wiring layer (not shown), and to the source or drain of the MOSFET 22 is connected a source or drain of the MOSFET 23 serving as the horizontal selection switch. Then, to the source or drain of the MOSFET 23 is connected a source or drain of the load MOSFET 24 forming the source follower amplifier. To the source or drain of both of the MOSFET 23 and MOSFET 24 are respectively connected a source or drain of the dark output transfer MOSFET 25 and the light output transfer MOSFET 26, and to the source or drain of the dark output transfer MOSFET 25 and the light output transfer MOSFET 26 are respectively connected the dark output accumulation capacitance 27 and the light output accumulation capacitance 28.

The CMOS sensor having such a construction operates as described below.

That is, at first, as shown in FIG. 14B, a control pulse $\emptyset_R$ for the control MOSFET 21 is turned to a high level, and the n+ type semiconductor region 15 is set to a power supply voltage VDD, to reset the signal charge of the photoelectric conversion region 14. Then, as shown in FIG. 14C, the control pulse $\emptyset_R$ for the control MOSFET 21 is made a low level voltage for preventing blooming.

During the signal charge accumulation, when due to the incident light, electron-hole pairs are generated in the region under the photoelectric conversion region 14, electrons accumulate in the depletion layer under the photoelectric conversion region 14, and holes are discharged through the p-type well layer 12. Here, in FIG. 14C, the region shown by grid-like hatching, having a potential deeper than the power supply voltage VDD shows that the region is not depleted. Since there is formed a potential barrier B by means of the control MOSFET 21, between the depletion layer formed in the p-type well layer 12 under the photoelectric conversion region 14, and the n+ type semiconductor region 15 serving as a floating diffusion layer, electrons exist under the photoelectric conversion region 14 during the photoelectric charge accumulation, as shown in FIG. 14C.

Subsequently, the potential of the photoelectric conversion region 14 changes depending on the number of accumulated electrons, and by outputting the potential change to the horizontal selection switch MOSFET 23 via the source of the source follower amplifier MOSFET 22 in the source follower operation, a photoelectric conversion characteristic having excellent linearity can be obtained.

Here, in the n+ type semiconductor region 15 serving as the floating diffusion layer, kTC noise due to reset is generated. However this can be removed by sampling and accumulating the dark-time output before the transfer of the signal electrons, and taking the difference with respect to the light-time output.

Recently, it has been proposed to unite various hardware such as a CPU, a memory, a standard/dedicated macro, an analog circuit and an image sensor portion (H/W integration), and various software such as image compression extensions, speech processing and communication functions (S/W integration) on one chip, and design a device as a "System on Chip" (SOC) in which an LSI unit is a semiconductor including a desired system/device functional operation. To produce a solid state imaging device as this SOC, it is required to produce the logic circuit portion 106 by utilizing heretofore accumulated technology and adapt to the solid state imaging device consolidating technology for integrating different processes on one chip.

Here, in the CMOS sensor obtained as an SOC, there has been a demand that the image sensor portion 101 is formed at the same time as the logic circuit portion 106 to thereby obtain the SOC, utilizing the CMOS process with the standard parameters widely used for processors, semiconductor memories such as DRAMs or the like and logic circuits, and these are formed on one chip in one process flow, thereby making it possible to share the production line with semiconductor memories and processors.

However, in the conventional solid state imaging device described above having compatibility with the CMOS manufacturing process, the impurity concentration in the p-type well layer 12 is set high for miniaturization of the MOS structure. Therefore the coupling capacitance between the p-type well layer 12 and the n+ type semiconductor region 14 increases so that the charge detection capacitance (particularly, the coupling capacitance related to the n+ type semiconductor region 14) increases. Hence there is a problem in that the detection sensitivity decreases. That is since the depletion layer at the connection portion between the p-type well layer 12 and the n+ type semiconductor region 14 is narrow, the photoelectric conversion rate due to the incident light (particularly, light on the red side having low energy and a long wavelength) decreases, causing a problem in that the detection sensitivity decreases.

To solve the problem of the decrease in detection sensitivity, it can be considered to simply reduce the concentration of the p-type well layer 12, and extend the depletion layer toward the p-type semiconductor substrate 11 side. However in such a case, there is a problem in that the threshold voltage and saturation current value of the transistor fluctuate. Moreover, the depletion layer extends not only toward the p-type semiconductor substrate 11 side, but also in the outward direction of the n+ type semiconductor region 14, seen in plan view, in particular, toward the n+ type semiconductor region 15. Hence, a so-called punch-through of the n+ type semiconductor region 14 and the n+ type semiconductor region 15 occurs, causing a problem in that the transistor characteristics (operating characteristics) decrease.

There is also a demand for improving the degree of integration and increasing the number of pixels per unit area. However, if the number of pixels per unit area is increased, respective basic cells are brought close to each other. In such a case, it is necessary to maintain a predetermined gap between these basic cells, in order to maintain separation characteristics between respective basic cells. However as described above, in the case where the concentration of the p-type well layer 12 is reduced to extend the depletion layer toward the p-type semiconductor substrate 11 side, there is a problem in that the depletion layer extends not only toward the p-type semiconductor substrate 11 side, but also toward the p+ type semiconductor region 13 side constituting the device separation region, causing a decrease in the device separation characteristics.

Moreover, as described above, when the concentration of the p-type well layer 12 is reduced, it is necessary to change established production parameters in the manufacturing method. Hence the p-type well layer 12 cannot be produced in the same step as the CMOS circuit manufacturing process having prescribed values for parameters, thus requiring an additional step. Therefore it is not possible to utilize the characteristics of the CMOS sensor where the logic circuit, analog circuit and A/D conversion circuit, etc. can be formed at the same time, and the image sensor portion 101 can be formed on the semiconductor chip the same for a semiconductor memory and a processor, and the production line can be shared with semiconductor memories and processors. Hence, a special process is used as with the CCD sensor, so that there is a possibility that the feature of the CMOS sensor where production costs are reduced, cannot be realized.

SUMMARY OF THE INVENTION

In view of the above situation, the present invention is aimed at achieving the following objects:
(a) To maintain transistor characteristics (operating characteristics);
(b) To improve detection sensitivity;
(c) To improve power conversion efficiency;

(d) To improve photoelectric conversion efficiency;
(e) To enable extension of the depletion layer;
(f) To reduce coupling capacitance;
(g) To maintain separation characteristics between pixels;
(h) To reduce the occurrence of crosstalk;
(i) To maintain high withstanding voltage characteristics;
(j) To make an SOC possible;
(k) To reduce process-wise load without changing standard parameters;
(l) To use standard macros and reduce production costs;
(m) To provide a solid state imaging device having the above described characteristics;
(n) To provide a manufacturing method for a solid state imaging devices having the above described characteristics;

Moreover, the present invention is aimed at achieving the following objects:
(o) To provide a photoelectric conversion device having the above described characteristics and a manufacturing method therefor;
(p) To provide a light receiving element having the above described characteristics and a manufacturing method therefor; and
(q) To provide a photocoupler having the above described characteristics and a manufacturing method therefor.

The photoelectric conversion device of the present invention solves the above described problems by having a first conductive type well layer provided on a semiconductor substrate and a second conductive type light receiving region (photoelectric conversion region) provided on the well layer, and at a position under the second conductive type light receiving region, there is provided a first conductive type impurity layer (depletion layer forming layer) in which an impurity concentration thereof is set to be lower than that of the well layer for enabling a reduction in coupling capacitance, such that at least a part of the first conductive type impurity layer is located inside of the second conductive type light receiving region, seen in plan view, for enabling extension of a depletion layer.

The present invention can be applied to a solid state imaging device which is an active XY addressing type CMOS sensor where a photoelectric conversion portion and a logic circuit portion (CMOS circuit portion) are formed on a semiconductor substrate with the same process, and a potential change due to charges generated in the photoelectric conversion portion is output.

The present invention can be applied to a light receiving element having a light receiving portion having a light receiving region, and a logic circuit portion used for control or signal processing in the light receiving portion.

The present invention can be applied to a photocoupler comprising the above described light receiving element and a corresponding light emission element.

With the present invention, the first conductive type impurity layer (depletion layer forming layer) can have a layer thickness approximately the same as that of the well layer located at a position under the second conductive type light receiving region.

Here, the first conductive type impurity layer (depletion layer forming layer) may be connected to the semiconductor substrate being of a first conductive type, or an impurity concentration of the first conductive type impurity layer (depletion layer forming layer) may be set to be the same as that of the semiconductor substrate being of the first conductive type. Moreover the first conductive type impurity layer (depletion layer forming layer) may be integrated with the semiconductor substrate being of the first conductive type.

In the present invention, a first conductive type deep well layer is provided in the semiconductor substrate, in contact with a lower side of the first conductive type well layer, and an impurity concentration thereof is set to be the same as or lower than that of the well layer. An impurity concentration of the first conductive type deep well layer can be set to be higher than that of the semiconductor substrate being of the first conductive type, or higher than that of the first conductive type impurity layer (depletion layer forming layer) in contact with the first conductive type deep well layer.

The present invention solves the above described problems by having a first conductive type well layer provided on a semiconductor substrate and a second conductive type light receiving region (photoelectric conversion region) provided on the well layer, and at a position under the second conductive type light receiving region, there is provided a second conductive type impurity layer (reverse depletion layer forming layer) in which an impurity concentration thereof is set to be lower than that of the light receiving region for enabling a reduction in coupling capacitance, such that at least a part of the second conductive type impurity layer is located inside of the second conductive type light receiving region, seen in plan view, for enabling extension of a depletion layer.

The present invention may have a construction such that a second conductive type impurity layer (reverse depletion layer forming layer) is provided in contact with a lower side of the second conductive type light receiving region, such that an impurity concentration thereof is set to be lower than that of the second conductive type light receiving region (photoelectric conversion region), and at least a part of the second conductive type impurity layer is located inside of the second conductive type light receiving region (photoelectric conversion region), seen in plan view, and the second conductive type impurity layer (reverse depletion layer forming layer) is located between the first conductive type impurity layer (depletion layer forming layer) and the second conductive type light receiving region, and the first conductive type impurity layer (depletion layer forming layer) is provided such that at least a part thereof is located inside of the second conductive type impurity layer (reverse depletion layer forming layer), seen in plan view, and the total thickness of the second conductive type impurity layer (reverse depletion layer forming layer) and the first conductive type impurity layer (depletion layer forming layer) has approximately the same layer thickness as that of the well layer located at a position under the second conductive type light receiving region.

With the present invention, the first conductive type impurity layer (depletion layer forming layer) in contact with the second conductive type light receiving region may comprise a plurality of layers. Moreover this may have a sloping impurity concentration, and the impurity concentration of the respective layers or the sloping impurity concentration may be set so as to decrease from the deep side of the semiconductor substrate toward the second conductive type light receiving region. Furthermore, the first conductive type impurity layer (depletion layer forming layer) in contact with the second conductive type impurity layer (reverse depletion layer forming layer) may comprise a plurality of layers or have a sloping impurity concentration, and the impurity concentration of the respective layers or the sloping impurity concentration may be set so as to decrease from the deep side of the semiconductor substrate toward the second conductive type impurity layer (reverse depletion layer forming layer). Furthermore, the second conductive type impurity layer (reverse depletion layer forming layer) in contact with the second conductive type light receiving region may comprise a plurality of layers or have a sloping impurity concentration, and the impurity concentration of the respective layers or the sloping impurity concentration may be set so as to decrease from the second conductive type light receiving region side toward a deep side of the semiconductor substrate.

In the present invention, it is possible to select a technique whether the semiconductor substrate is the first conductive type or the second conductive type.

In the present invention, it is possible to set the impurity concentration of the second conductive type light receiving region to be lower than the impurity concentration of an other second conductive type diffusion layer.

In the present invention, it is possible to have a logic circuit portion which is driven by the voltage by means of an output from the second conductive type light receiving region.

In the present invention, preferably various hardware such as a CPU, a memory, a standard/dedicated macro, an analog circuit and an image sensor portion (H/W integration) and various software such as image compression extensions, speech processing and communication functions (S/W integration) are composed on one chip, so that an LSI unit is produced as SOC "System on Chip" which is a semiconductor including a desired system/device functional operation.

The present invention is a manufacturing method for a photoelectric conversion device having a first conductive type well layer provided on a semiconductor substrate and a second conductive type light receiving region (photoelectric conversion region) provided on the well layer, and at a position under the second conductive type light receiving region, there is provided a first conductive type impurity layer (depletion layer forming layer) in which the impurity concentration thereof is set to be lower than that of the well layer for enabling a reduction in coupling capacitance, such that at least a part of the first conductive type impurity layer is located inside of the second conductive type light receiving region, seen in plan view, for enabling extension of a depletion layer. The above described problems are solved by having a step for forming a first conductive type well layer on the semiconductor substrate; a step for forming the second conductive type light receiving region (photoelectric conversion region) on the well layer; and a step for forming the first conductive type impurity layer (depletion layer forming layer).

The present invention is a manufacturing method for a photoelectric conversion device having a first conductive type well layer provided on a semiconductor substrate, and a second conductive type light receiving region (photoelectric conversion region) provided on the well layer, and at a position under the second conductive type light receiving region, there is provided a second conductive type impurity layer (reverse depletion layer forming layer) in which an impurity concentration thereof is set to be lower than that of the light receiving region for enabling a reduction in coupling capacitance, such that at least a part of the second conductive type impurity layer is located inside of the second conductive type light receiving region, seen in plan view, for enabling extension of a depletion layer. The above described problems are solved by having a step for forming the first conductive type well layer on the semiconductor substrate; a step for forming the second conductive type light receiving region (photoelectric conversion region) on the well layer; and a step for forming the second conductive type impurity layer (reverse depletion layer forming layer).

The present invention may have a step for forming a first conductive type deep well layer wherein an impurity concentration thereof is set to be higher than that of the semiconductor substrate being of the first conductive type, or an impurity concentration thereof is set to be lower than that of the well layer, or an impurity concentration thereof is set to be higher than that of the first conductive type impurity layer (depletion layer forming layer).

The present invention may have a step for forming a second conductive type impurity layer (reverse depletion layer forming layer) provided in contact with a lower side of the second conductive type light receiving region such that an impurity concentration thereof is set to be lower than that of the second conductive type light receiving region (photoelectric conversion region), and at least a part of the second conductive type impurity layer is located inside of the second conductive type light receiving region (photoelectric conversion region), seen in plan view. Moreover, the present invention may have a step for forming a second conductive type impurity layer (reverse depletion layer forming layer) between the first conductive type impurity layer (depletion layer forming layer) and the second conductive type light receiving region, such that an impurity concentration thereof is set to be lower than that of the light receiving region, and at least a part thereof is located inside of the light receiving region, seen in plan view, and at least a part thereof is located outside of the first conductive type impurity layer (depletion layer forming layer), seen in plan view.

The present invention may have a step for forming the second conductive type light receiving region having an impurity concentration set to be lower than that of an other second conductive type diffusion layer.

In the present invention, preferably various hardware such as a CPU, a memory, a standard/dedicated macro, an analog circuit and an image sensor portion (H/W integration) and various software such as image compression extensions, speech processing and communication functions (S/W integration) are composed on one chip, so that an LSI unit is produced as an SOC "System on Chip" which is a semiconductor including a desired system/device functional operation.

In the photoelectric conversion device of the present invention, a first conductive type impurity layer (depletion layer forming layer) having an impurity concentration set to be lower than the well layer, is provided at a position under the second conductive type light receiving region, for enabling a reduction in the coupling capacitance. As a result, the coupling capacitance in a connection portion between the second conductive type light receiving region (photoelectric conversion region) and the first conductive type impurity layer (depletion layer forming layer) is reduced to improve the power conversion efficiency. Moreover, by providing the first conductive type impurity layer (depletion layer forming layer) such that at least a part thereof is located inside of the second conductive type light receiving region, seen in plan view, for enabling extension of the depletion layer, then when the depletion layer is extended toward the semiconductor substrate side, extension of the depletion layer in the outward direction of the second conductive type light receiving region, seen in plan view, can be prevented. Therefore, parasitic capacitance can be reduced, enabling an increase of the potential change due to the signal charge, and an improvement in the power conversion efficiency. As a result, the photoelectric conversion efficiency can be improved.

Furthermore, by providing the first conductive type impurity layer (depletion layer forming layer) located inside of the second conductive type light receiving region, seen in plan view, then when the depletion layer is extended toward the semiconductor substrate deep side, extension of the depletion layer in the outward direction of the second conductive type light receiving region, seen in plan view, can be prevented. Hence, it becomes possible to improve the photoelectric conversion efficiency, while maintaining the transistor characteristics (operating characteristics) and the device separation characteristics.

By applying the present invention to a solid state imaging device which is an active XY addressing type CMOS sensor wherein a photoelectric conversion region and a logic circuit portion (CMOS circuit portion) are formed on a semiconductor substrate with the same process, and a potential change due to charges generated in the photoelectric conversion region is output, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load, compared to the CCD sensor which uses a special process to which it is difficult to directly apply the CMOS circuit manufacturing process.

By applying the present invention to a light receiving element having a light receiving portion and a logic circuit portion used for control or signal processing in the light receiving portion (photoelectric conversion portion), wherein the photoelectric conversion portion and the logic circuit portion (CMOS circuit portion or the like) are formed on a semiconductor substrate with the same process, the operating characteristics of the light receiving element can be improved. Moreover the manufacturing steps are reduced compared to a light receiving element produced using a special manufacturing process, enabling a reduction in process-wise load.

By applying the present invention to a photocoupler comprising the above described light receiving element and a corresponding light emission element, the operating characteristics of the light receiving element can be improved. Moreover the manufacturing steps are reduced as described above, enabling a reduction in process-wise load.

With the present invention, the first conductive type impurity layer (depletion layer forming layer) has a layer thickness approximately the same as that of the well layer located at a position under the second conductive type light receiving region. Hence the coupling capacitance is reduced in a connection portion between the second conductive type light receiving region and the first conductive type impurity layer (depletion layer forming layer), to improve the power conversion efficiency, as well as enabling extension of the depletion layer toward the deep side of the semiconductor substrate. In addition, while maintaining the transistor characteristics (operating characteristics), the parasitic capacitance can be reduced, enabling an increase in the potential change due to the signal charge, and an improvement in the power conversion efficiency. Moreover, the photoelectric conversion efficiency can be improved. This result enables an improvement in detection sensitivity.

Here, the first conductive type impurity layer (depletion layer forming layer) is connected to the semiconductor substrate being of the first conductive type, or an impurity concentration of the first conductive type impurity layer (depletion layer forming layer) is set to be the same as that of the semiconductor substrate being of the first conductive type. Furthermore, since the first conductive type impurity layer (depletion layer forming layer) is integrated with the semiconductor substrate being of the first conductive type, it is possible to reduce the manufacturing steps, to thereby reduce process-wise load and reduce production costs.

In the present invention, the first conductive type deep well layer is provided on the semiconductor substrate, with an impurity concentration set to be the same as or lower than that of the well layer, and the impurity concentration of the first conductive type deep well layer is set to be higher than that of the semiconductor substrate being of the first conductive type, or higher than that of the first conductive type impurity layer (depletion layer forming layer) in contact with the first conductive type deep well layer. As a result, the coupling capacitance is reduced at the connection portion between the first conductive type deep well layer and the first conductive type impurity layer (depletion layer forming layer), enabling improvement in the power conversion efficiency. That is, crosstalk where floating charges generated in the deep portion of the semiconductor substrate leak into adjacent other pixels can be prevented by the first conductive type deep well layer provided therein.

The present invention has a first conductive type well layer provided on a semiconductor substrate and a second conductive type light receiving region (photoelectric conversion region) provided on the well layer, and at a position under the second conductive type light receiving region, there is provided a second conductive type impurity layer (reverse depletion layer forming layer) in which an impurity concentration thereof is set to be lower than that of the light receiving region for enabling a reduction in the coupling capacitance, such that at least a part of the second conductive type impurity layer is located inside of the second conductive type light receiving region, seen in plan view, for enabling extension of a depletion layer. As a result, extension of the depletion layer toward the semiconductor substrate deep side, at the connection portion of the second conductive type light receiving region and the second conductive type impurity layer (reverse depletion layer forming layer) is possible, enabling a reduction in the coupling capacitance and an improvement in photoelectric conversion efficiency.

Furthermore, by providing the second conductive type impurity layer (reverse depletion layer forming layer) located inside of the second conductive type light receiving region (photoelectric conversion region), seen in plan view, then when the depletion layer is extended toward the semiconductor substrate deep side, extension of the depletion layer in the outward direction of the second conductive type light receiving region, seen in plan view, can be prevented. Hence, the photoelectric conversion efficiency can be improved, while maintaining the transistor characteristics (operating characteristics) and the device separation characteristics.

In the present invention, the second conductive type impurity layer (reverse depletion layer forming layer) is located between the first conductive type impurity layer (depletion layer forming layer) and the second conductive type light receiving region, and the total thickness of the second conductive type impurity layer (reverse depletion layer forming layer) and the first conductive type impurity layer (depletion layer forming layer) has approximately the same layer thickness as that of the well layer located at a position under the second conductive type light receiving region. As a result, the coupling capacitance is reduced at the connection portion between the second conductive type impurity layer (reverse depletion layer forming layer) and the first conductive type impurity layer (depletion layer forming layer), enabling improvement in the power conversion efficiency. Moreover, since the second conductive type impurity layer (reverse depletion layer forming layer) is provided such that at least a part of the second conductive type impurity layer is located inside of the second conductive type light receiving region, seen in plan view, and the first conductive type impurity layer (depletion layer forming layer) is provided such that at least a part of the first conductive type impurity layer is located inside of the second conductive type impurity layer (reverse depletion layer forming layer), seen in plan view, the coupling capacitance can be reduced in each connection portion. In addition, when the depletion layer is extended toward the deep side of the semiconductor substrate, extension of the depletion layer in the outward direction of the second conductive type light receiving region, seen in plan view, can be prevented. Moreover, while the transistor characteristics (operating characteristics) and the separation characteristics between pixels are maintained, the photoelectric conversion efficiency can be improved.

In the present invention, the first conductive type impurity layer (depletion layer forming layer) in contact with the second conductive type light receiving region comprises a plurality of layers, or has a sloping impurity concentration, and the impurity concentration or the sloping impurity concentration of respective layers is set so as to decrease from the semiconductor substrate side toward the second conductive type light receiving region. Hence, the coupling capacitance can be reduced at this connection portion and at other connection portions with the semiconductor substrate or with the first conductive type deep well layer, enabling improvement in the power conversion efficiency. That is, crosstalk where floating charges generated in the deep portion of the semiconductor substrate leak into adjacent other pixels can be prevented by the first conductive type deep well layer provided therein.

Moreover, the first conductive type impurity layer (depletion layer forming layer) in contact with the second conductive type impurity layer (reverse depletion layer forming layer) comprises a plurality of layers or has a sloping impurity concentration, and it is set such that the impurity concentration or the sloping impurity concentration of respective layers decreases from the semiconductor substrate side toward the second conductive type impurity layer (reverse depletion layer forming layer). As a result, the coupling capacitance can be reduced at the connection portion between these and at other connection portions with the semiconductor substrate or with the first conductive type deep well layer, enabling improvement in the power conversion efficiency.

Furthermore, the second conductive type impurity layer (reverse depletion layer forming layer) in contact with the second conductive type light receiving region comprises a plurality of layers, or has a sloping impurity concentration, and the impurity concentration or the sloping impurity concentration of respective layers is set so as to decrease from the second conductive type light receiving region side toward the semiconductor substrate side. Hence, the coupling capacitance can be reduced at this connection portion and at other connection portions with the first conductive type impurity layer (depletion layer forming layer), enabling improvement in the power conversion efficiency. As a result, maintenance of high withstanding voltage characteristics, and a further improvement in photoelectric conversion efficiency can be achieved.

In the present invention, it is possible to select a technique where the semiconductor substrate is of a first conductive type or of a second conductive type together with the existence of a first conductive type deep well layer. When the semiconductor substrate is of the second conductive type, charges photoelectrically converted in the deep portion of the second conductive type semiconductor substrate can be prevented from flowing into adjacent pixels, thereby reducing the occurrence of crosstalk.

In the present invention, the impurity concentration of the second conductive type light receiving region (photoelectric conversion region) is set to be lower than that of an other second conductive type diffusion layer, thereby enabling a reduction in parasitic capacitance.

At the same time, by setting the impurity concentration of the second conductive type light receiving region to be lower than that of an other second conductive type diffusion layer serving as a reset drain region which is, for example, a drain of the control gate, the second conductive type light receiving region (photoelectric conversion region) which is converted into floating diffusion differs from the other second conductive type diffusion layer. Hence a reduction is possible in image defects generally referred to as "white defects" due to leaks resulting from defects occurring at the time of forming the second conductive type light receiving region (photoelectric conversion region). Therefore the operating characteristics can be improved.

When the present invention has a logic circuit portion which is driven by the voltage by means of the output from the second conductive type light receiving region (photoelectric conversion region), the power conversion efficiency can be improved as described above, and operating characteristics can be improved.

The present embodiment composes various hardware such as a CPU, a memory, a standard/dedicated macro, an analog circuit and an image sensor portion (H/W integration), and various software such as image compression extensions, speech processing and communication functions (S/W integration) on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, a CPU, a memory, a standard/dedicated macro, an analog circuit, and an image sensor portion etc., can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

The present invention is a manufacturing method for a photoelectric conversion device having a first conductive type well layer provided on a semiconductor substrate and a second conductive type light receiving region (photoelectric conversion region) provided on the well layer, and at a position under the second conductive type light receiving region, there is provided a first conductive type impurity layer (depletion layer forming layer) in which the impurity concentration thereof is set to be lower than that of the well layer for enabling a reduction in the coupling capacitance, such that at least a part of the first conductive type impurity layer is located inside of the second conductive type light receiving region, seen in plan view, for enabling extension of the depletion layer, wherein the manufacturing method adopts means having: a step for forming the first conductive type well layer on the semiconductor substrate; a step for forming the second conductive type light receiving region (photoelectric conversion region) on the well layer; and a step for forming the first conductive type impurity layer (depletion layer forming layer). Alternatively, the present invention is a manufacturing method for a photoelectric conversion device having a first conductive type well layer provided on a semiconductor substrate and a second conductive type light receiving region (photoelectric conversion region) provided on the well layer, and at a position under the second conductive type light receiving region, there is provided a second conductive type impurity layer (reverse depletion layer forming layer) in which the impurity concentration thereof is set to be lower than that of the second conductive type light receiving region for enabling a reduction in the coupling capacitance, such that at least a part of the second conductive type impurity layer is located inside of the second conductive type light receiving region, seen in plan view, for enabling extension of the depletion layer, wherein the manufacturing method adopts means having: a step for forming the first conductive type well layer on the semiconductor substrate; a step for forming the second conductive type light receiving region (photoelectric conversion region) on the well layer; and a step for forming the second conductive type impurity layer (reverse depletion layer forming layer). As a result, the coupling capacitance can be reduced, the depletion layer can be extended, the high withstanding voltage characteristics, the transistor characteristics (operating characteristics) and the separation characteristics between pixels can be maintained, the power conversion efficiency as well as the photoelectric conversion efficiency can be improved, and the detection sensitivity can be improved. In addition, compared to the CCD sensor which uses a special process to which it is difficult to directly apply the CMOS circuit manufacturing process, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load.

The present invention can provide a manufacturing method for a photoelectric conversion device, wherein by having a step for forming the first conductive type deep well layer in which the impurity concentration thereof is set to be higher than that of the semiconductor substrate being of the first conductive type, or lower than that of the well layer, or higher than that of the first conductive type impurity layer (depletion layer forming layer), it becomes possible to select the semiconductor substrate being of the first conductive type or the second conductive type. Moreover prevention of the occurrence of crosstalk, a further reduction in coupling capacitance, and maintenance of the high withstanding voltage characteristics can be effected.

The present invention can provide a manufacturing method for a photoelectric conversion device, wherein by having a step for forming the second conductive type impurity layer (reverse depletion layer forming layer) between the first conductive type impurity layer (depletion layer forming layer) and the second conductive type light receiving region, such that the impurity concentration thereof is set to be lower than that of the second conductive type light receiving region, and at least a part thereof is located inside of the second conductive type light receiving region, seen in plan view, and at least a part thereof is located outside of the first conductive type impurity layer (depletion layer forming layer), seen in plan view, extension of the depletion layer is made possible, the coupling capacitance can be reduced, and the operating characteristics and the separation characteristics between pixels are maintained.

The present invention can provide a manufacturing method for a photoelectric conversion device, which can further reduce parasitic capacitance, by having a step for forming the second conductive type light receiving region with an impurity concentration set to be lower than that of an other second conductive type diffusion layer.

At the same time, by setting the impurity concentration of the second conductive type light receiving region to be lower than that of an other second conductive type diffusion layer serving as a reset drain region which is, for example, a drain of the control gate, the second conductive type light receiving region (photoelectric conversion region) which becomes floating diffusion differs from the other second conductive type diffusion layer. Hence a reduction is possible in image defects generally referred to as "white defect" due to leaks resulting from defects occurring at the time of forming the second conductive type light receiving region (photoelectric conversion region). Hence, the operating characteristics can be improved.

The present embodiment composes various hardware such as a CPU, a memory, a standard/dedicated macro, an analog circuit and an image sensor portion (H/W integration), and various software such as image compression extensions, speech processing and communication functions (S/W integration) on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, a CPU, a memory, a standard/dedicated macro, an analog circuit, and an image sensor portion etc., can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

BRIEF DESCRIPTION OF THE DRAWINGS

FIGS. 14B and 14C show potential conditions for illustrating operating conditions.

DETAILED DESCRIPTION OF THE INVENTION

Hereunder, a first embodiment of a photoelectric conversion device and a manufacturing method of the same according to the present invention are described with reference to the attached drawings.

Figure 1A:
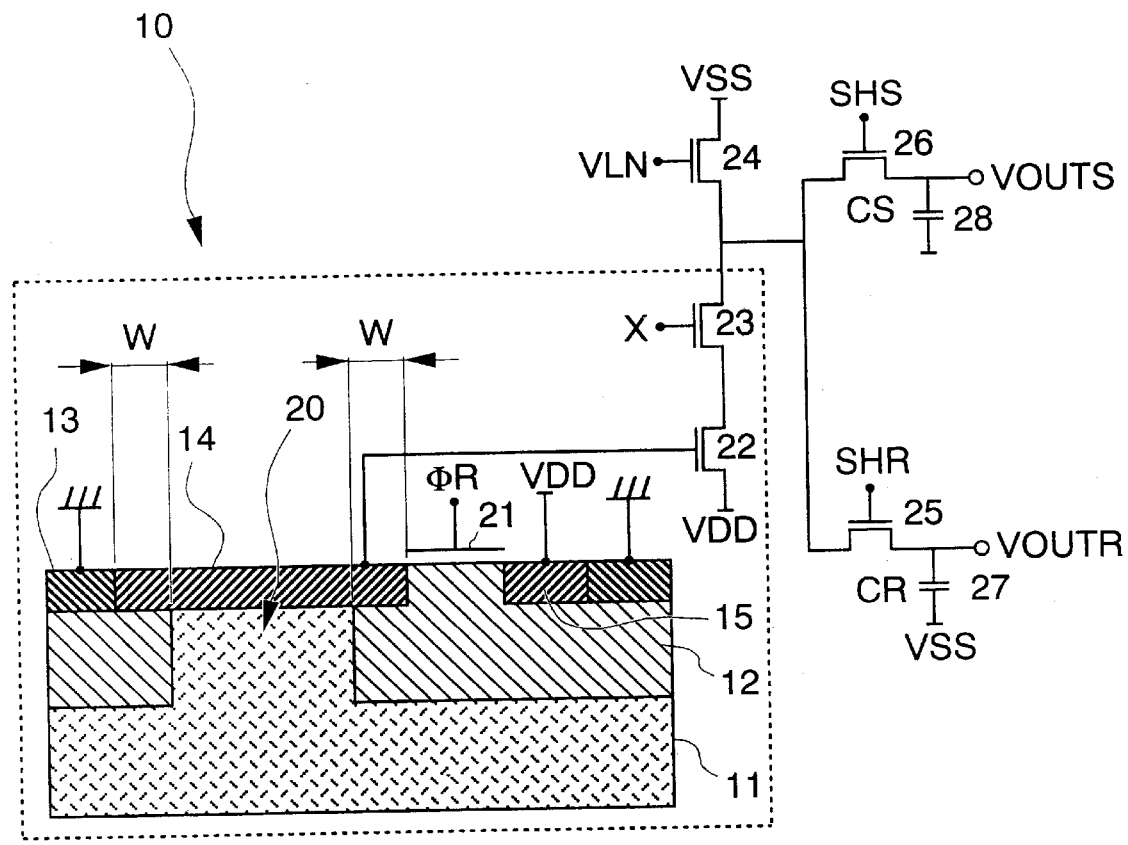
FIGS. 1A and 1B are schematic cross-sectional side views showing a first embodiment of a photoelectric conversion device of according to the present invention.
Figure 1B:
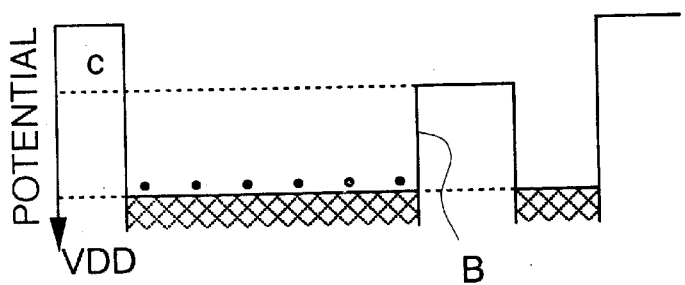
Figure 2:
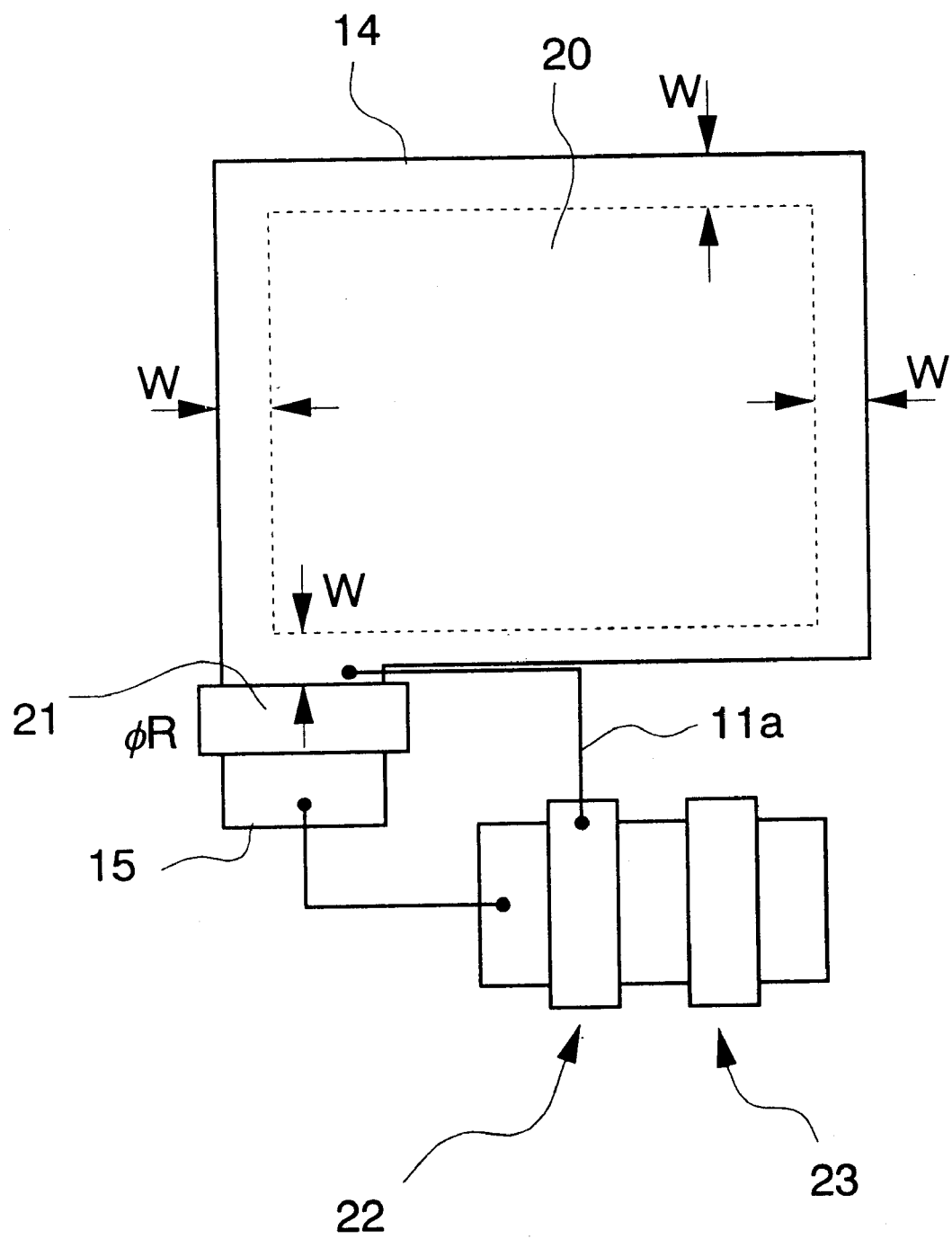
FIG. 2 is a schematic plan view showing the photoelectric conversion device of FIG. 1.

FIGS. 1A and 1B are schematic cross-sectional side views showing a first embodiment of a photoelectric conversion device of according to the present invention. FIG. 2 is a schematic plan view showing the photoelectric conversion device of FIG. 1. FIGS. 3A to 3D are process diagrams showing a first embodiment of a manufacturing method for a photoelectric conversion device according to the present invention.

Figure 13:
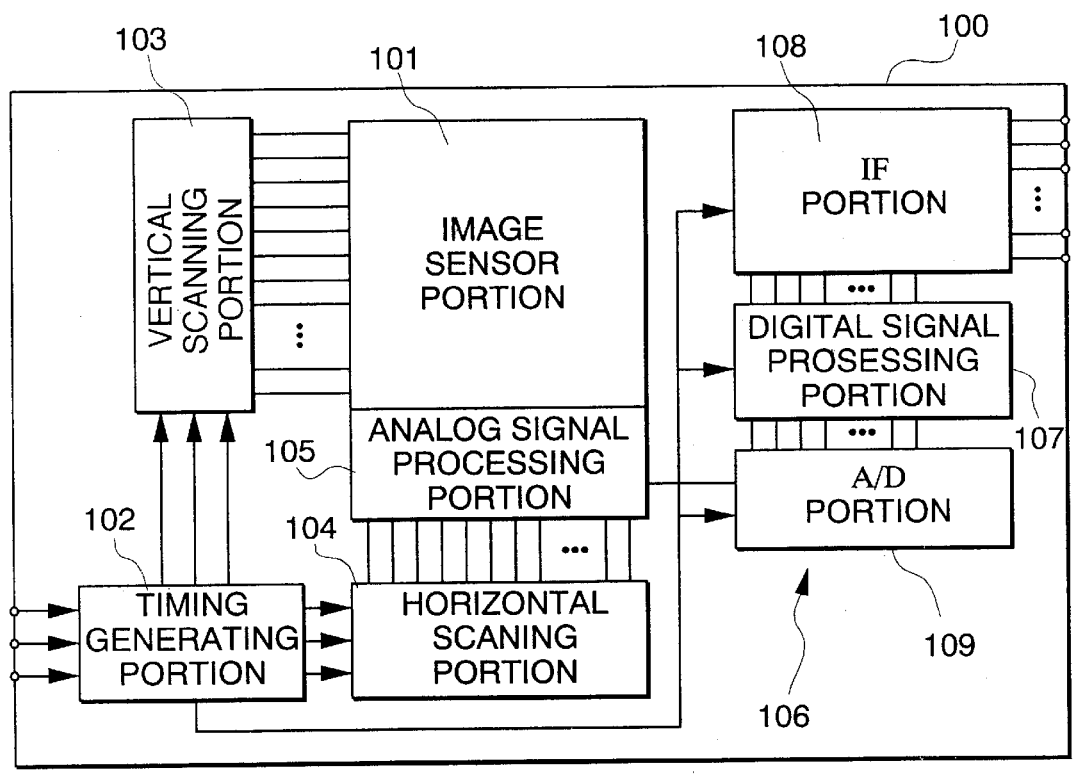
FIG. 13 is a schematic plan view showing one example of a photoelectric conversion device.

According to the present embodiment, a solid state imaging device is applied as the photoelectric conversion device. The solid state imaging device is a CMOS sensor 100 of an active XY addressing type, particularly as shown in FIG. 13.

Such a CMOS sensor 100 is provided with a timing generation portion 102, an image sensor portion 101, a vertical scanning portion 103 and a horizontal scanning portion 104 for selecting an output of a pixel, an analog signal processing portion 105, an A/D portion (A/D conversion portion) 109 for performing analog to digital conversion, a digital signal processing portion 107 for converting the digitalized signal into an output signal, and an interface portion (IF portion) 108 for outputting digital image data to the outside and receiving command data from the outside. The image sensor portion 101 is an aggregate of basic cells of the CMOS sensor, as described later, and the vertical scanning portion 103 is for controlling the vertical scanning of the basic cells in the image sensor portion 101, and the horizontal scanning portion 104 is for controlling the horizontal scanning of the basic cells in the image sensor portion 101. These portions perform respective scanning control with a timing signal output from the timing generation portion 102. The analog signal processing portion 105 subjects the image signal read from the image sensor portion 101 to required processing and outputs the signal to the A/D conversion portion 109. The A/D conversion portion 109 then converts the image signal into a digital signal and outputs the signal to the digital signal processing portion 107, which in turn outputs the image signal to the interface portion 108. The interface portion 108 can output the digital image data output via the digital signal processing portion 107 to the outside, and can also input commands from the outside. As a result, the respective constituents are controlled so as to perform control corresponding to the received command to enable control of the mode and the output signal form of the image sensor 100 and the signal output timing, corresponding to the commands.

Here, the A/D conversion portion 109, the digital signal processing portion 107, and the interface portion 108 constitute a logic circuit portion 106. Moreover, the digital signal processing portion 107 includes a memory portion. The memory portion may be constructed such that this stores image data for one or a plurality of lines, one or a plurality of blocks, and one or a plurality of frames, required for the signal processing, with these being utilized for the signal processing in the digital signal processing portion 107. In addition, the construction may be such that the timing generation portion 102 is incorporated in the vertical scanning portion 103, the horizontal scanning portion 104 and the like.

A basic cell in the image sensor portion 101 of the CMOS sensor 100 in this embodiment is shown in FIG. 1 and FIG. 2. In FIG. 1 and FIG. 2, reference numeral 10 denotes a basic cell (CMOS sensor), 11 denotes a p-type semiconductor substrate, 12 denotes a p-type well layer formed on the p-type semiconductor substrate, 14 denotes an n+ type region serving as a photodiode (photoelectric conversion region), 13 denotes a p+ type semiconductor region serving as a device separation region that separates the photoelectric conversion region 14 from an adjacent cell, 15 denotes a reset drain region comprising an n+ type semiconductor region serving as a drain of a control MOSFET, 21 denotes the control MOSFET, 22 denotes a MOSFET of a source follower amplifier, 23 denotes a MOSFET of a horizontal selection switch, 24 denotes a load MOSFET of the source follower amplifier, 25 denotes a dark output transfer MOSFET, 26 denotes a light output transfer MOSFET, 27 denotes a dark output accumulation capacitance, and 28 denotes a light output accumulation capacitance.

The CMOS sensor 10 comprises, on a semiconductor substrate (for example, a silicon substrate) 11 of the first conductive type (hereinafter, described as a p-type), the first conductive type well layer (p-type well layer) 12 having an impurity concentration higher than that of the p-type substrate 11, and in a position on the upper side of the p-type well layer 12, and the second conductive type light receiving region (photoelectric conversion region) 14 being of an n+ type impurity region.

The light receiving region 14 is one in which n-conductive type impurities (for example, arsenic, phosphorus, etc.) are diffused in a concentration of, for example, from about $1 \times 10^{18}/cm^3$ to about $1 \times 10^{22}/cm^3$.

Moreover, at a position under the light receiving region 14, there is provided a p-type impurity layer (depletion layer forming layer) 20 having an impurity concentration set to be lower than that of the well layer 12 for enabling a reduction in the coupling capacitance, such that as shown in FIG. 2, a part of the p-type impurity layer 20 is located inside of the light receiving region 14, seen in plan view, for enabling extension of the depletion layer.

As shown in FIG. 1 and FIG. 2, the p-type impurity layer (depletion layer forming layer) 20 has an outline located inward by a distance W from the outline of the light receiving region 14, seen in plan view, at a position under the light receiving region 14.

The p-type impurity layer (depletion layer forming layer) 20 has, as shown in FIG. 1, a layer thickness approximately the same as that of the p-type well layer 12 at a position under the light receiving region 14. Moreover, the upper side thereof is connected to the lower side of the light receiving region 14, and the lower side thereof is connected to the p-type semiconductor substrate 11.

Furthermore, the impurity concentration of the p-type impurity layer (depletion layer forming layer) 20 is set to be the same as that of the p-type semiconductor substrate 11.

That is, the p-type impurity layer (depletion layer forming layer) 20 is formed integrally with the p-type semiconductor substrate 11, as shown in FIG. 1.

In the p-type semiconductor substrate 11, as shown in FIG. 2, a source follower amplifier is provided at a position adjacent to the light receiving region 14, and the light receiving region 14 is connected, as shown in FIG. 1 and FIG. 2, via a wiring layer 11a to, for example, a gate of the MOSFET 22 constituting the source follower amplifier provided at a position adjacent to the light receiving region 14. In FIG. 2, the source follower amplifier is depicted schematically.

To the source or drain of the MOSFET 22 constituting the source follower amplifier are connected a reset drain region 15 comprising an n+ type semiconductor region serving as a drain of the control MOSFET and a source or drain of the MOSFET 23 serving as a horizontal selection switch, and to the source or drain of the MOSFET 23 is connected a source or drain of the load MOSFET 24 forming a source follower amplifier.

To the source or drain of both of the MOSFET 23 and the MOSFET 24 are respectively connected a source or drain of the dark output transfer MOSFET 25 and the light output transfer MOSFET 26, and to the source or drain of the dark output transfer MOSFET 25 and the light output transfer MOSFET 26 are respectively connected the dark output accumulation capacitance 27 and the light output accumulation capacitance 28.

The CMOS sensor having such a construction operates as described below.

That is, at first, a control pulse $\emptyset_R$ for the control MOSFET 21 is made a high level, and the n+ type semiconductor region 15 is set to a power supply voltage VDD, to reset the signal charge of the photoelectric conversion region 14. Then, the control pulse $\emptyset_R$ for the control MOSFET 21 is made a low level voltage for preventing blooming.

During the signal charge accumulation, when due to the incident light, electron-hole pairs are generated in the n-type semiconductor region (light receiving region) 14 serving as a photoelectric conversion region and in the region under the photoelectric conversion region 14, electrons accumulate in the depletion layer formed in the n-type semiconductor region (light receiving region) 14 serving as the photoelectric conversion region and in the p-type impurity layer (depletion layer forming layer) 20 under the n-type semiconductor region (light receiving region) 14, and holes are discharged through the p-type well layer 12. Here, since there is formed a potential barrier B by means of the control MOSFET 21, between the depletion layer formed in the n-type semiconductor region (light receiving region) 14 and the p-type impurity layer (depletion layer forming layer) 20 under the n-type semiconductor region (light receiving region) 14, and the reset drain region 15 comprising the n+ type semiconductor region serving as a floating diffusion layer, electrons exist in the n-type semiconductor region (light receiving region) 14 serving as the photoelectric conversion region and in the p-type impurity layer (depletion layer forming layer) 20 under the n-type semiconductor region (light receiving region) 14.

Subsequently, the potential of the n-type semiconductor region (light receiving region) 14 serving as the photoelectric conversion region changes, depending on the number of accumulated electrons, and by outputting this potential change to the horizontal selection switch MOSFET 23 via the source of the source follower amplifier MOSFET 22 in the source follower operation, photoelectric conversion characteristics having excellent linearity can be obtained.

According to the CMOS sensor 10 in this embodiment, since the p-type impurity layer (depletion layer forming layer) 20 in which the impurity concentration thereof is set to be lower than that of the p-type well layer 12, is provided at a position under the n-type semiconductor region (light receiving region) 14 for enabling a reduction in the coupling capacitance, it becomes possible to extend the depletion layer formed in the p-type impurity layer (depletion layer forming layer) 20 toward the deep side of the p-type semiconductor substrate 11. As a result, the coupling capacitance in a connection portion between the n-type semiconductor region (light receiving region) 14 and the p-type impurity layer (depletion layer forming layer) 20 can be decreased more than the connection condition between the n-type semiconductor region (light receiving region) 14 and the p-type well layer 12. Therefore, the charge detection capacity decreases, and hence the potential change due to the signal charge can be increased, enabling an improvement in the photoelectric conversion efficiency and an improvement in the detection sensitivity.

Moreover, since the p-type impurity layer (depletion layer forming layer) 20 is provided such that at least a part thereof is located inside of the n-type semiconductor region (light receiving region) 14, seen in plan view, the p-type impurity layer (depletion layer forming layer) 20 has a gap, as seen in plan view, from the photoelectric conversion region of adjacent pixels or the reset drain region 15 or the like. Therefore, when the depletion layer is extended toward the deep side of the p-type semiconductor substrate 11, at the same time, the depletion layer also extends in the outward direction of the p-type impurity layer (depletion layer forming layer) 20, seen in plan view. However, in this case also, variation in the threshold voltage and saturated current value of the transistor, and extension of the depletion layer to outside of the n-type semiconductor region (light receiving region) 14, seen in plan view, can be prevented. Hence, it becomes possible to sufficiently extend the depletion layer toward the deep side of the p-type semiconductor substrate 11 side. As a result, the coupling capacitance in the connection portion between the n-type semiconductor region (light receiving region) 14 and the p-type impurity layer (depletion layer forming layer) 20 can be decreased more than the connection condition between the n-type semiconductor region (light receiving region) 14 and the p-type well layer 12. Therefore, the charge detection capacity can be reduced, and hence the potential change due to the signal charge can be increased, enabling an improvement in the photoelectric conversion efficiency and an improvement in the detection sensitivity.

Furthermore, since the p-type impurity layer (depletion layer forming layer) 20 is provided so as to be located inside of the n-type semiconductor region (light receiving region) 14, seen in plan view, when the depletion layer is extended toward the deep side of the p-type semiconductor substrate 11, extension of the depletion layer in the outward direction of the n-type semiconductor region (light receiving region) 14, seen in plan view, can be prevented. As a result, it becomes possible to prevent the threshold voltage and saturated current value of the transistor from fluctuating, and a so-called punch-through of the n+ type semiconductor region 14 and the n+ type semiconductor region 15 from occurring. That is, it becomes possible to prevent the transistor characteristics (operating characteristics) from deteriorating, to thereby maintain the high withstanding voltage characteristics between the n+ type semiconductor region 14 and the n+ type semiconductor region 15, enabling maintenance of the transistor characteristics (operating characteristics) of the source follower amplifier MOSFET 22. Moreover, since the depletion layer extends in the outward direction of the n-type semiconductor region (light receiving region) 14, seen in plan view, it is possible to prevent extension of the depletion layer toward the p-type semiconductor region 13 side serving as the device separation region, and the decrease in the device separation characteristics. At the same time, it becomes possible to sufficiently extend the depletion layer toward the deep side of the p-type semiconductor substrate 11, while maintaining the transistor characteristics (operating characteristics) and the separation characteristics between pixels, enabling an improvement in the photoelectric conversion efficiency, power conversion efficiency and detection sensitivity.

Next is a description of a manufacturing method for a photoelectric conversion device of the present embodiment.

FIGS. 3A to 3D are process diagrams for explaining a manufacturing method for a photoelectric conversion device of the present embodiment.

Figure 3A:
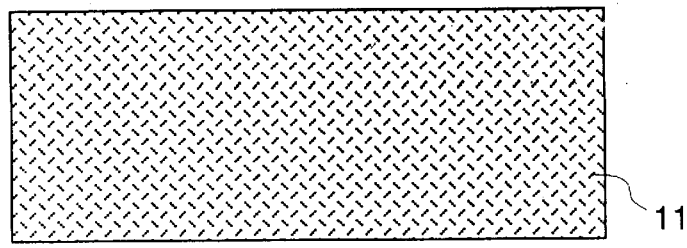
FIGS. 3A to 3D are process diagrams showing a first embodiment of a manufacturing method for a photoelectric conversion device according to the present invention.

At first, as shown in FIG. 3A a p-type silicon substrate 11 is prepared.

Figure 3B:
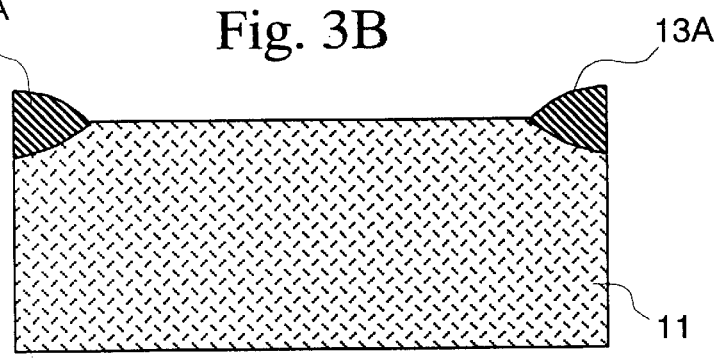

Next, as shown in FIG. 3B, a field oxide film 13A is formed for device separation.

[Process for Forming p-type Well Layer 12 and p-type Impurity Layer (Depletion Layer Forming Layer) 20]

Figure 3C:
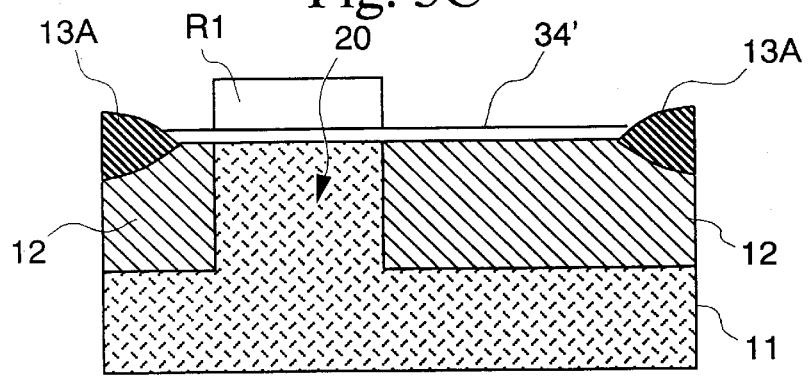

Next, as shown in FIG. 3C, an $SiO_2$ film 34' is formed. Then, in the p-type silicon substrate 11, as shown in FIG. 2 a region comprising the p-type impurity layer (depletion layer forming layer) 20 having an outline located inward by a distance W from the outline of the light receiving region 14, seen in plan view, is coated with a resist R1, and boron (B) ions are implanted, to form a p-type well layer 12 in the portion other than the p-type impurity layer (depletion layer forming layer) 20. Ion implantation is performed three times in succession under conditions such as; implantation energy −300 keV, dose amount $1 \times 10^{13}/cm^3$, then 100 keV, $5 \times 10^{12}/cm^2$, and then 60 keV, $2.5 \times 10^{12}/cm^2$.

[Process for Forming Light Receiving Region (Photoelectric Conversion Region) 14]

Figure 3D:
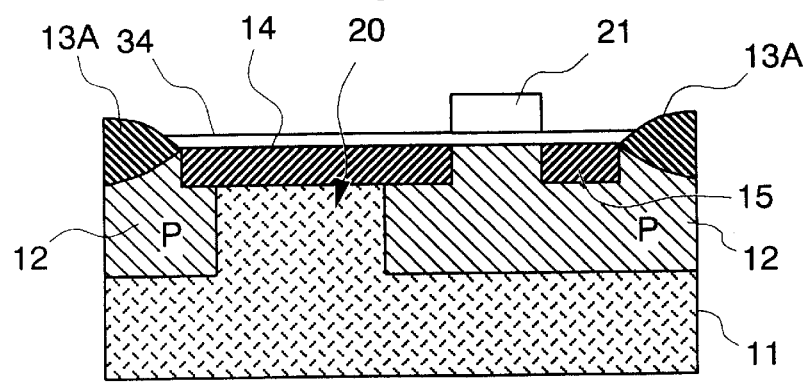
Figure 4A:
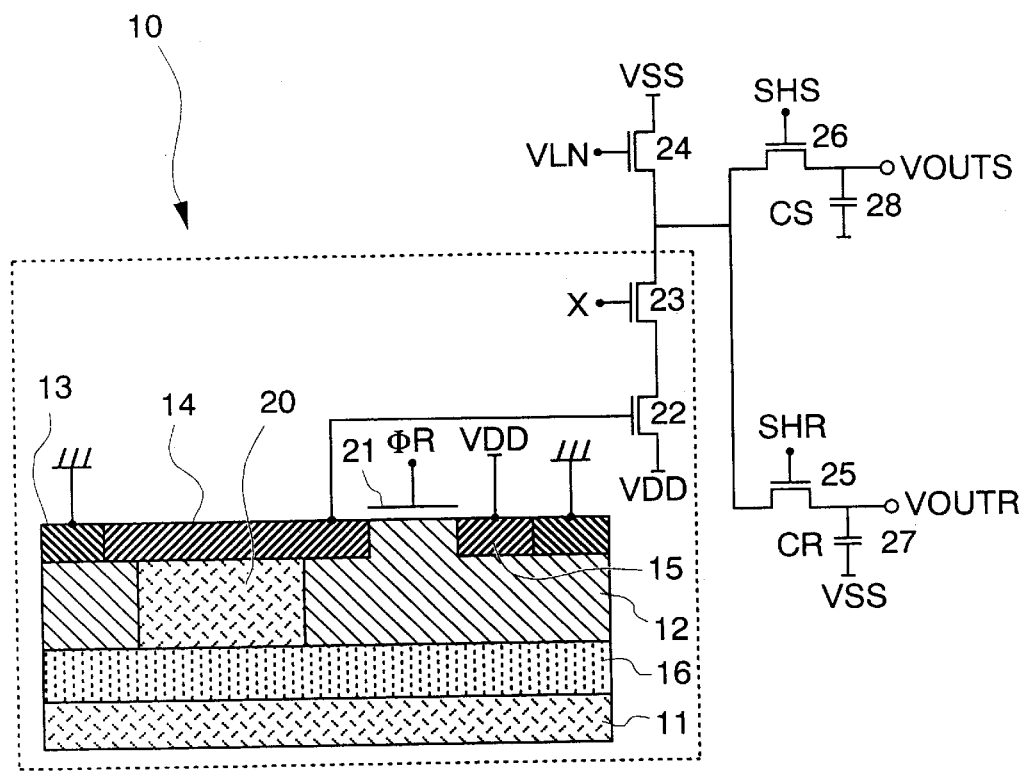
FIGS. 4A and 4B are schematic cross-sectional side views showing a second embodiment of a photoelectric conversion device of according to the present invention.
Figure 4B:
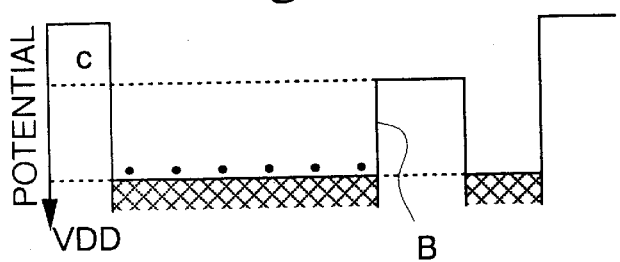

Next, as shown in FIG. 3D, an $SiO_2$ film 34 of around 10 nm thickness is formed, and after which a reset gate 21 is formed on the $SiO_2$ film. The gate 21 may be formed from a polysilicon, or a polycide comprising a two layer construction of a polysilicon and a W silicide.

Then, the region other than the reset drain region 15 and the light receiving region 14 having an outline located outward by a distance W from the outline of the p-type impurity layer (depletion layer forming layer) 20, seen in plan view, is coated with a resist. Subsequently, for example arsenic (As) is implanted at an implant energy of 70 keV, and dose amount $1 \times 10^{16}/cm^2$, to form the reset drain region 15 comprising an n+ type region, and a photoelectric conversion region 14 comprising an n-type region.

After this, an interlayer film, wiring, and a shield film etc. are formed to thereby produce the basic cell as shown in FIG. 1 and FIG. 2.

The present embodiment has: a step for forming the p-type well layer 12 on the p-type semiconductor substrate 11; a step for forming the p-type impurity layer (depletion layer forming layer) 20 formed integral with the p-type semiconductor substrate 11 which has a layer thickness approximately the same as that of the p-type well layer 12, on the p-type semiconductor substrate 11; and a step for forming the light receiving region (photoelectric conversion region) 14 having an outline located outward by a distance W from the outline of the p-type impurity layer (depletion layer forming layer) 20. The step for forming the p-type well layer 12 and the step for forming the p-type impurity layer (depletion layer forming layer) 20 are performed simultaneously. As a result, the coupling capacitance can be reduced, the depletion layer can be extended, the high withstanding voltage characteristics, the transistor characteristics (operating characteristics) and the separation characteristics between pixels can be maintained, the power conversion efficiency as well as the photoelectric conversion efficiency can be improved, and the detection sensitivity can be improved. In addition, compared to the CCD sensor which uses a special process to which it is difficult to directly apply the CMOS circuit manufacturing process, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load.

In the present embodiment, various hardware such as a CPU, a memory, a standard/dedicated macro, an analog circuit and an image sensor portion (H/W integration), and various software such as image compression extensions, speech processing and communication functions (S/W integration) are united on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, the logic circuit portion 106 having a CPU, a memory, a standard/dedicated macro, and an analog circuit, and the image sensor portion 101 can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

Here in the manufacturing method, in the step for forming the logic circuit portion etc. by the CMOS process, it is not necessary to change the established production parameters. Hence the transistor characteristics (operating characteristics) obtained can be maintained. Therefore an SOC can be made in the condition where the CMOS process having historical advantages can be utilized for the design and characteristics.

In the present embodiment, by setting the impurity concentration of for example the other n-type diffusion layer constituting the reset drain region 15, and the beforementioned light receiving region 14 to be the same, and forming these with the same process, the manufacturing processes can be reduced, process-wise load reduced, and production costs reduced.

Furthermore, this may also have a step for forming the light receiving region 14 having an impurity concentration set to be lower than the impurity concentration of for example the other n-type diffusion layer constituting the reset drain region 15. As a result leaking of the charge to the reset drain region 15 can be prevented and noise can be reduced. Hence it is possible to provide a production method for a photoelectric conversion device giving an improvement in operating characteristics.

In the present embodiment, it is possible to have the p-type impurity layer (depletion layer forming layer) 20 as a plurality of layers. Here the p-type impurity layer (depletion layer forming layer) 20 may be a plurality of layers, with the impurity concentration of the respective layers set to be the same as that of the p-type semiconductor substrate 11 at the layer which contacts the p-type semiconductor substrate 11, and an inclination can be set in the impurity concentration of the plurality of layers so that the impurity concentration decreases from this layer on the p-type semiconductor substrate 11 side toward the layer on the light receiving region 14 side. Moreover, the p-type impurity layer (depletion layer forming layer) 20 may comprise a single layer and have a sloping impurity concentration, and the sloping impurity concentration may be set so as to reduce from the p-type semiconductor substrate 11 side with an impurity concentration the same as that of the p-type semiconductor substrate 11, toward the light receiving region 14 side.

In this way, in the connection portion between the p-type impurity layer (depletion layer forming layer) 20 and the light receiving region 14, and the connection portion between the p-type impurity layer (depletion layer forming layer) 20 and the semiconductor substrate 11, the coupling capacitance can be further reduced, thus enabling an improvement in the photoelectric conversion efficiency and the detection sensitivity.

Furthermore, the distance W by which the outline of the p-type impurity layer (depletion layer forming layer) 20 is located inward from the outline of the light receiving region (photoelectric conversion region) 14, seen in plan view, may be set as a different distance for each of the positions of the overall periphery.

Hereunder is a description based on the drawings, of a second embodiment of a photoelectric conversion device and a manufacturing method therefor according to the present invention.

Figure 5A:
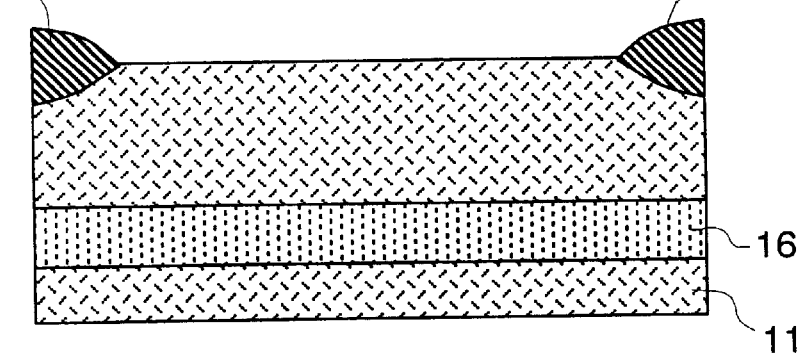
FIGS. 5A to 5C are process diagrams showing a second embodiment of a manufacturing method for a photoelectric conversion device according to the present invention.
Figure 5B:
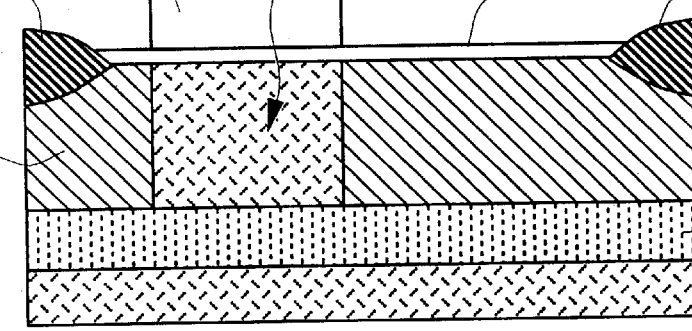
Figure 5C:
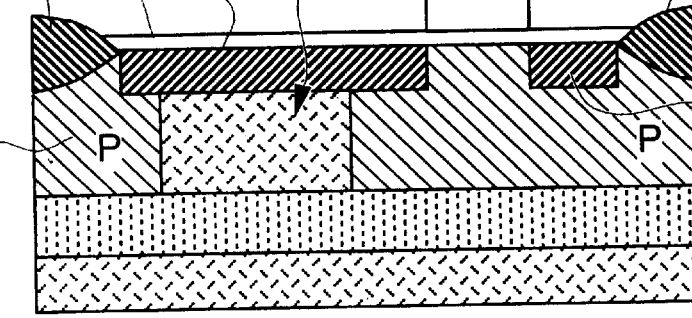

FIGS. 4A to 4D are schematic cross-sectional side view showing a photoelectric conversion device of this embodiment, and FIG. 5C to 5E are process diagrams showing a manufacturing method for the photoelectric conversion device in FIG. 3.

With respect to this embodiment, the point which is different to the first embodiment shown in FIG. 1 through FIG. 3, is the point that there is provided a deep well layer of a first conductive type. Constituents which are approximately the same as those in the first embodiment shown in FIG. 1 through FIG. 3, are denoted by the same reference symbols.

In this embodiment, a p-type deep well layer 16 is provided over the whole face of the p-type semiconductor substrate 11.

The impurity concentration of the p-type deep well layer 16 is set to be higher than that of the p-type semiconductor substrate 11. Moreover, preferably this is set higher than that of the p-type impurity layer (depletion layer forming layer) 20 which contacts the p-type deep well layer 16.

The p-type deep well layer 16 contacts the lower side of the p-type well layer 12, and the impurity concentration may be set to be the same as or lower than that of the p-type well layer 12.

In this embodiment, results the same as for the first embodiment shown in FIG. 1 through FIG. 3 can be obtained. Moreover, by providing the p-type deep well layer 16, the flow of charge into the adjacent pixels through the p-type semiconductor substrate 11 can be prevented. Hence the occurrence of the crosstalk phenomena can be prevented.

Next is a description of a manufacturing method for a photoelectric conversion device of this embodiment.

FIGS. 5A to 5C are process diagrams for explaining the manufacturing method for the photoelectric conversion device of this embodiment.

In the manufacturing method of this embodiment, manufacture is by the same process as for the manufacturing process of the first embodiment shown in FIG. 3, from FIG. 3A up to FIG. 3B.

[Process for Forming p-type Deep Well Layer 16]

Next, as shown in FIG. 5A, an $SiO_2$ film 34' is formed. Then, a p-type deep well layer 16 which has been implanted with boron (B) ions and has a predetermined depth range over the whole face of the p-type silicon substrate 11, is formed over the whole face of the p-type silicon substrate 11. Ion implantation is performed under conditions such as; implantation energy −500 keV and dose amount $5×10^{12}/cm^2$.

[Process for Forming p-type Well Layer 12 and p-type Impurity Layer (Depletion Layer Forming Layer) 20]

Next, as shown in FIG. 5B, a region comprising the p-type impurity layer (depletion forming layer) 20 of the p-type silicon substrate 11, is coated with a resist R1, and boron (B) ions are implanted, to form a p-type well layer 12 in the portion other than the p-type impurity layer (depletion layer forming layer) 20. Ion implantation is performed three times in succession under conditions such as: implantation energy −300 keV, dose amount $1×10^{13}/cm^2$, then 100 keV, $5×10^{12}/cm^2$, and then 60 keV, $2.5×10^{12}/cm^2$.

[Process for Forming Light Receiving Region (Photoelectric Conversion Region) 14]

Next, as shown in FIG. 5C, an $SiO_2$ film 34 of around 10 nm thickness is formed, and after which a reset gate 21 is formed on the $SiO_2$ film 34. The gate 21 can be formed from a polysilicon, or a polycide comprising a two layer construction of a polysilicon and a W silicide.

Then, the region other than the reset drain region 15 and the light receiving region 14 having an outline located outward by a distance W from the outline of the p-type impurity layer (depletion layer forming layer) 20, seen in plan view, is coated with a resist. Subsequently, for example arsenic (As) is implanted at an implant energy of 70 keV, and dose amount $1×10^{16}/cm^2$, to form the reset drain region 15 comprising an n+ type region, and a photoelectric conversion region 14 comprising an n-type region.

After this, an interlayer film, wiring, and a shield film are formed to thereby produce the basic cell as shown in FIG. 4.

The present embodiment, as with the first embodiment shown in FIG. 1 through FIG. 3 has: a step for forming the p-type well layer 12 on the p-type semiconductor substrate 11; a step for forming the p-type impurity layer (depletion layer forming layer) 20 formed integral with the p-type semiconductor substrate 11 which has a layer thickness approximately the same as that of the p-type well layer 12, on the p-type semiconductor substrate 11; and a step for forming the light receiving region (photoelectric conversion region) 14 having an outline located outward by a distance W from the outline of the p-type impurity layer (depletion layer forming layer) 20. The step for forming the p-type well layer 12 and the step for forming the p-type impurity layer (depletion layer forming layer) 20 are performed simultaneously. Moreover, this has a step for forming a p-type deep well layer 16 wherein the impurity concentration thereof is set to be lower than that of the p-type well layer 12, or the impurity concentration thereof is set to be higher than that of the p-type semiconductor substrate 11, or the impurity concentration thereof is set to be higher than that of the p-type impurity layer (depletion layer forming layer) 20. As a result, the coupling capacitance can be reduced, the depletion layer can be extended, the high withstanding voltage characteristics, the transistor characteristics (operating characteristics) and the separation characteristics between pixels can be maintained, the power conversion efficiency as well as the photoelectric conversion efficiency can be improved, and the detection sensitivity can be improved. In addition, compared to the CCD sensor which uses a special process to which it is difficult to directly apply the CMOS circuit manufacturing process, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load. In addition to demonstrating this effect, the occurrence of leakage (crosstalk) into adjacent pixels of the charge which has been photoelectrically converted, can be prevented by the deep portion of the p-type semiconductor substrate 11.

Moreover, in the present embodiment, various hardware such as a CPU, a memory, a standard/dedicated macro, an analog circuit and an image sensor portion (H/W integration), and various software such as image compression extensions, speech processing and communication functions (S/W integration) are united on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, the logic circuit portion 106 having a CPU, a memory, a standard/dedicated macro, and an analog circuit, and the image sensor portion 101 can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

Here in the manufacturing method, in the step for forming the logic circuit portion etc. by the CMOS process, it is not necessary to change the established production parameters. Hence the transistor characteristics (operating characteristics) obtained in the past can be maintained. Therefore an SOC can be made in the state where the design and characteristics of the CMOS process having historical advantages can be obtained.

In the present embodiment, it is possible to have the p-type impurity layer (depletion layer forming layer) 20 as a plurality of layers. Here the p-type impurity layer (depletion layer forming layer) 20 may be a plurality of layers, with the impurity concentration of the respective layers set to be the same as that of the p-type deep well layer 16 at the layer which contacts the p-type deep well layer 16, and an inclination can be set in the impurity concentration of the plurality of layers so that the impurity concentration decreases from this layer on the p-type deep well layer 16 side toward the layer on the light receiving region 14 side. Moreover, the p-type impurity layer (depletion layer forming layer) 20 may comprise a single layer and have a sloping impurity concentration, and the sloping impurity concentration may be set so as to reduce from the p-type deep well layer 16 side with an impurity concentration the same as that of the p-type deep well layer 16, toward the light receiving region 14 side.

In this way, in the connection portion between the p-type impurity layer (depletion layer forming layer) 20 and the light receiving region 14, and in the connection portion between the p-type impurity layer (depletion layer forming layer) 20 and the p-type deep well layer 16, the coupling capacitance can be further reduced, thus enabling an improvement in the power conversion efficiency and the detection sensitivity.

Hereunder is a description based on the drawings, of a third embodiment of a photoelectric conversion device and a manufacturing method therefor according to the present invention.

Figure 6A:
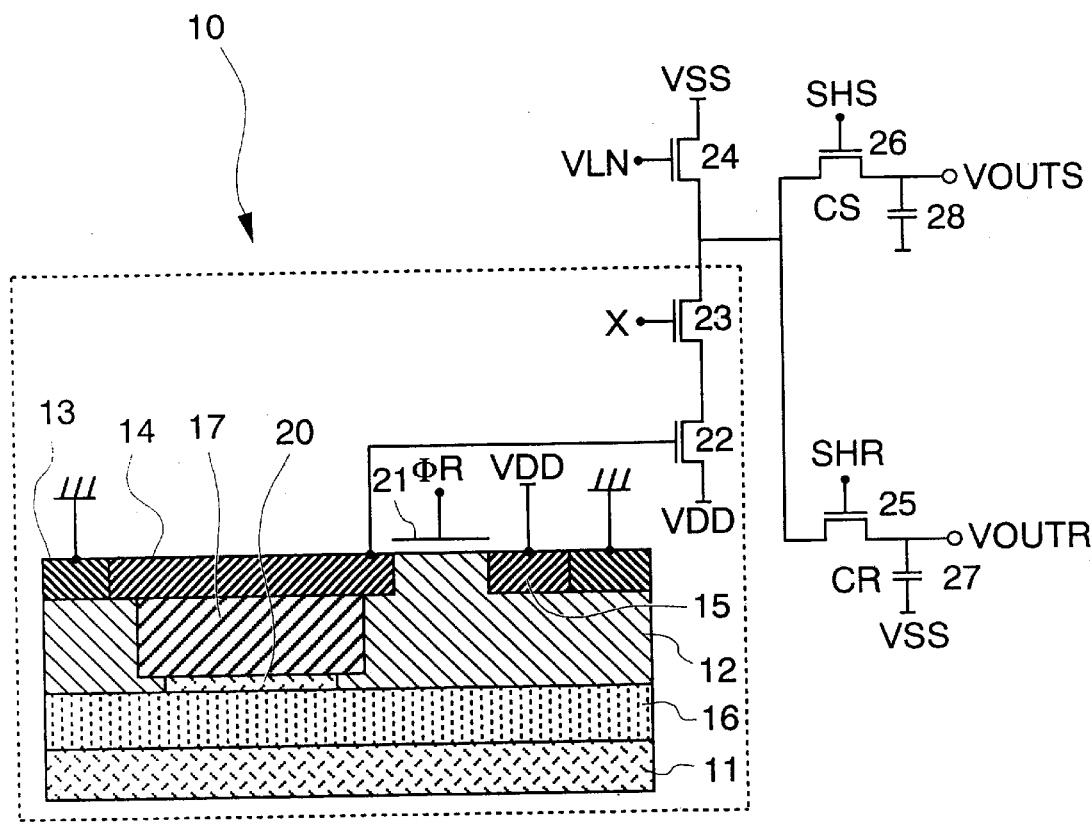
FIGS. 6A and 6B are schematic cross-sectional side views showing a third embodiment of a photoelectric conversion device of according to the present invention.
Figure 6B:
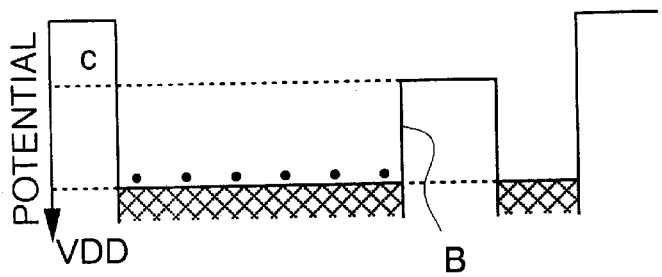
Figure 7:
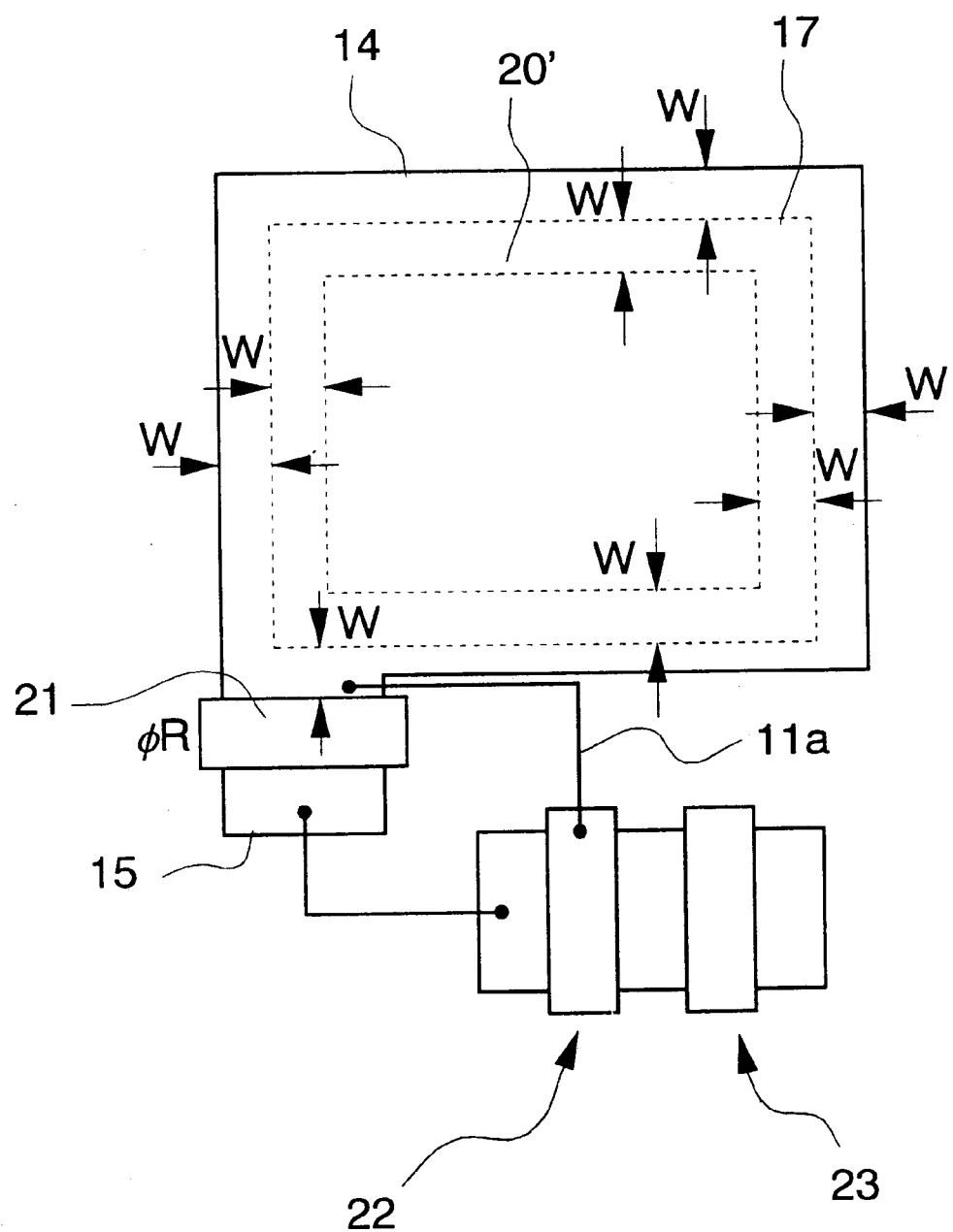
FIG. 7 is a schematic plan view showing the photoelectric conversion device of FIG. 6A.

FIG. 6 is a schematic cross-sectional side view of a photoelectric conversion device of this embodiment, and FIG. 7 is a schema in plan view showing the photoelectric conversion device of this embodiment.

In this embodiment, the point which is different to the second embodiment shown in FIG. 4 through FIG. 5, is the point that there is provided a second conductive type impurity layer (reverse depletion layer forming layer). Constituents which are approximately the same as those in the second embodiment shown in FIG. 4 through FIG. 5, are denoted by the same reference symbols.

This embodiment has a p-type well layer 12 provided on the p-type semiconductor substrate 11, and a light receiving region (photoelectric conversion region) 14 provided on the p-type well layer 12. In addition, at a position under the light receiving region 14, there is provided an n-type impurity layer (reverse depletion layer forming layer) 17 having an impurity concentration set to be lower than that of the light receiving region 14 for enabling a reduction in the coupling capacitance.

The n-type impurity layer (reverse depletion layer forming layer) 17, as shown in FIG. 7, is provided such that at least a part is located inside of the light receiving region seen in plan view, for enabling extension of the depletion layer.

As shown in FIG. 6 and FIG. 7, the n-type impurity layer (reverse depletion layer forming layer) 17 has an outline located inward by a distance W from the outline of the light receiving region 14, seen in plan view, at a position under the light receiving region 14.

Furthermore, a p-type impurity layer (depletion layer forming layer) 20 is provided at a position under the n-type impurity layer (reverse depletion layer forming layer) 17. The p-type impurity layer (depletion layer forming layer) 20 has, as shown in FIG. 6 and FIG. 7, an outline located inward by a distance W from the outline of the n-type impurity layer (reverse depletion layer forming layer) 17, seen in plan view, at a position under the light receiving region 14.

Here the total thickness of the n-type impurity layer (reverse depletion layer forming layer) 17 and the p-type impurity layer (depletion layer forming layer) 20 has a layer thickness approximately the same as that of the p-type well layer 12 at a position under the light receiving region 14. With this, as shown in FIG. 1, the upper side of the n-type impurity layer (reverse depletion layer forming layer) 17 is joined to the lower side of the light receiving region 14, the lower side of the n-type impurity layer (reverse depletion layer forming layer) 17 is connected to the p-type impurity layer (depletion layer forming layer) 20, and the lower side of the p-type impurity layer (depletion layer forming layer) 20 is connected to the p-type semiconductor substrate 11.

In this embodiment, results the same as for the first embodiment shown in FIG. 1 through FIG. 3 and the second embodiment shown in FIG. 4 through FIG. 5 may be demonstrated. Moreover, since the n-type impurity layer (reverse depletion layer forming layer) 17 with the impurity concentration set to be lower than that of the light receiving region (photoelectric conversion region) 14, is provided in contact with the under side of the light receiving region 14, it becomes possible to extend the depletion layer formed in the light receiving region 14 and the n-type impurity layer (reverse depletion layer forming layer) 17 toward the deep side of the p-type semiconductor substrate 11. As a result, the coupling capacitance in a connection portion between the light receiving region 14 and the n-type impurity layer (reverse depletion layer forming layer) 17 can be decreased. Therefore the charge detection capacity decreases, and hence the potential change due to the signal charge can be increased, enabling an improvement in the photoelectric conversion efficiency and an improvement in detection sensitivity.

Moreover, since the n-type impurity layer (depletion layer forming layer) 20 is provided such that at least a part thereof is located inside of the n-type semiconductor region (light receiving region) 14, seen in plan view, the n-type impurity layer (reverse depletion layer forming layer) 17 has a gap, seen in plan view, from the photoelectric conversion region of adjacent pixels and the reset drain region 15 or the like. Therefore, when the depletion layer is extended toward the deep side of the p-type semiconductor substrate 11, at the same time, the depletion layer also extends in the outward direction of the n-type impurity layer (reverse depletion layer forming layer) 17, seen in plan view. However, in this case also, extension of the depletion layer to outside of the n-type semiconductor region (light receiving region) 14, seen in plan view, can be prevented. Hence, it becomes possible to sufficiently extend the depletion layer toward the deep side of the p-type semiconductor substrate 11 side. As a result, the coupling capacitance in the connection portion between the n-type semiconductor region (light receiving region) 14 and the n-type impurity layer (reverse depletion layer forming layer) 17 can be decreased more than the connection condition between the n-type semiconductor region (light receiving region) 14 and the p-type well layer 12. Therefore, the charge detection capacity can be reduced, and hence the potential change due to the signal charge can be increased, enabling an improvement in the photoelectric conversion efficiency and an improvement in the detection sensitivity.

Furthermore, since the n-type impurity layer (reverse depletion layer forming layer) 17 is provided so as to be located inside of the n-type semiconductor region (light receiving region) 14, seen in plan view, when the depletion layer is extended toward the deep side of the p-type semiconductor substrate 11, extension of the depletion layer in the outward direction of the n-type semiconductor region (light receiving region) 14, seen in plan view, can be prevented. As a result, it becomes possible to prevent the threshold voltage and saturated current value of the transistor from fluctuating, and a so-called punchthrough of the n+ type semiconductor region 14 and the n+ type semiconductor region 15 from occurring. That is, it becomes possible to prevent the transistor characteristics (operating characteristics) from deteriorating, to thereby maintain the high withstanding voltage characteristics between the n+ type semiconductor region 14 and the n+ type semiconductor region 15, enabling maintenance of the transistor characteristics (operating characteristics) of the source follower amplifier MOSFET 22. Moreover, since the depletion layer extends in the outward direction of the n-type semiconductor region (light receiving region) 14, seen in plan view, it is possible to prevent extension of the depletion layer toward the p-type semiconductor region 13 side serving as the device separation region, and the decrease in the device separation characteristics. At the same time, it becomes possible to sufficiently extend the depletion layer toward the deep side of the p-type semiconductor substrate 11, while maintaining the transistor characteristics (operating characteristics) and the separation characteristics between pixels, enabling an improvement in the photoelectric conversion efficiency, power conversion efficiency and detection sensitivity.

Furthermore, in this embodiment, by providing the n-type impurity layer (reverse depletion layer forming layer) 17, then the depletion layer formed in the light receiving region 14, the n-type impurity layer (reverse depletion layer forming layer) 17, and the p-type impurity layer (depletion layer forming layer) 20 can extend into the deep side of the p-type semiconductor substrate 11. Hence the coupling capacitance in the connection portion between the n-type impurity layer (reverse depletion layer forming layer) 17 and the p-type impurity layer (depletion layer forming layer) 20 can be reduced.

Figure 14A:
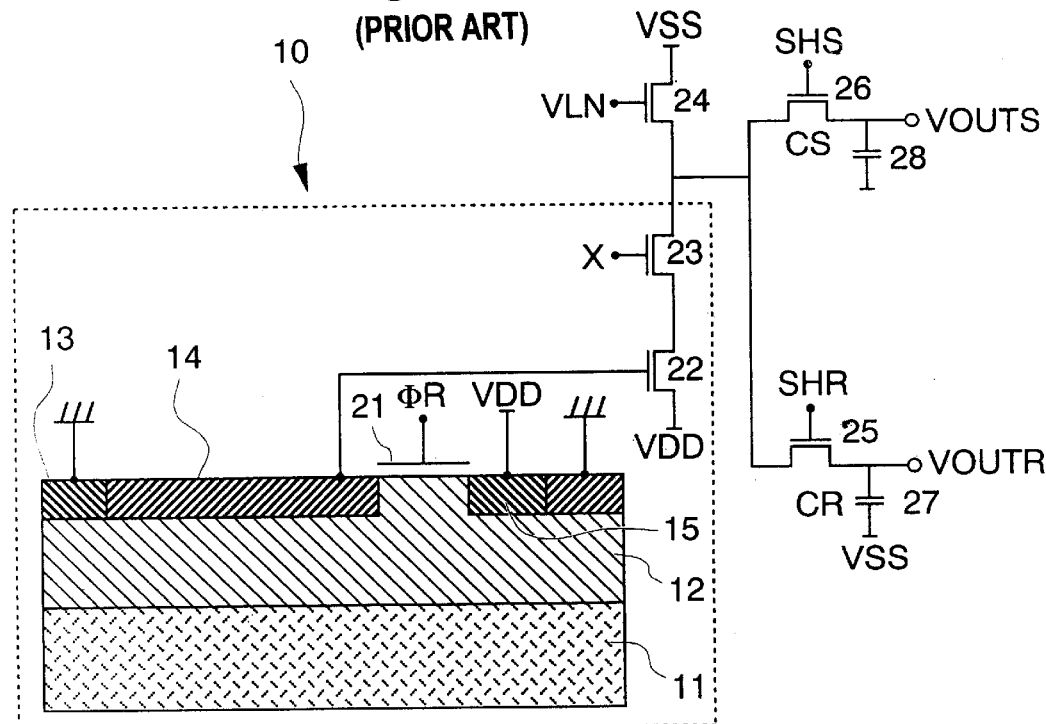
FIGS. 14A, 14B, and 14C are schematic cross-sectional side views showing a conventional photoelectric conversion device
Figure 14B:
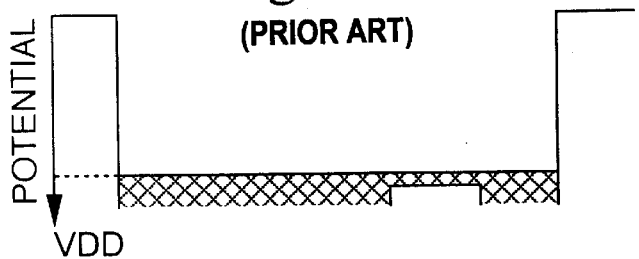
Figure 14C:
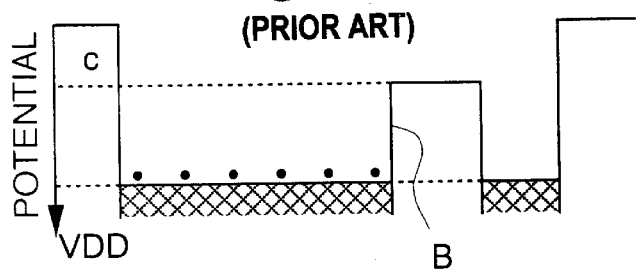

Consequently, the coupling capacitance in the connection portion between the light receiving region 14 and the n-type impurity layer (reverse depletion layer forming layer) 17, and in the connection portion between the n-type impurity layer (reverse depletion layer forming layer) 17 and the p-type impurity layer (depletion layer forming layer) 20 can be reduced. Hence the coupling capacitance in this embodiment can be reduced even more than the connection condition between the light receiving region 14 and the p-type well layer 12 shown in FIG. 14, and the connection condition between the light receiving region 14 and the p-type impurity layer (depletion layer forming layer) 20 shown in FIG. 1. Therefore the charge detection capacity becomes even smaller. Hence the potential change due to the signal charge can be further increased. Moreover, the photoelectric conversion efficiency can be improved, detection sensitivity improved, and in particular photoelectric conversion efficiency due to incident light on the long wavelength red side can be improved.

In this embodiment, both the n-type impurity layer (reverse depletion layer forming layer) 17 and the p-type impurity layer (depletion layer forming layer) 20 are provided. However a construction is also possible where the p-type impurity layer (depletion layer forming layer) 20 is not provided, and only the n-type impurity layer (reverse depletion layer forming layer) 17 with the impurity concentration set to be lower than that of the light receiving region 14 is provided in contact with the lower side of the light receiving region 14. As a result, the coupling capacitance in the connection portion between the light receiving region 14 and the n-type impurity layer (reverse depletion layer forming layer) 17, and in the connection portion between the n-type impurity layer (reverse depletion layer forming layer) 17 and the p-type deep well layer 16 is reduced, enabling an improvement in the photoelectric conversion efficiency.

Furthermore, the distance W by which the outline of the n-type impurity layer (reverse depletion layer forming layer) 17 is located inward from the outline of the light receiving region 14, seen in plan view, and the distance W by which the outline of the p-type impurity layer (depletion layer forming layer) 20 is located further inward from the outline of the n-type impurity layer (reverse depletion layer forming layer) 17, seen in plan view, are both set equal. However these may be set as different distances.

Moreover, these may be set different for the positions around the whole periphery.

Moreover, the outline of the n-type impurity layer (reverse depletion layer forming layer) 17 may be set so as to be located further inward from the outline of the p-type impurity layer (depletion layer forming layer) 20, seen in plan view, and the outline of the p-type impurity layer (depletion layer forming layer) 20 may be located inward from the outline of the light receiving region 14, seen in plan view.

Next is a description of a manufacturing method for a photoelectric conversion device of this embodiment.

FIG. 8 is a process diagram for explaining the manufacturing method for the photoelectric conversion device of this embodiment.

In the manufacturing method of this embodiment, manufacture is by the same process as for the manufacturing process of the first embodiment shown in FIG. 3, from FIG. 3A up to FIG. 3B, and manufacture is by the same process as for the manufacturing process of the second embodiment shown in FIG. 5, from FIG. 5A up to FIG. 5B.

[Process for Forming n-type Impurity Layer (Reverse Depletion Layer Forming Layer) 17]

Figure 8A:
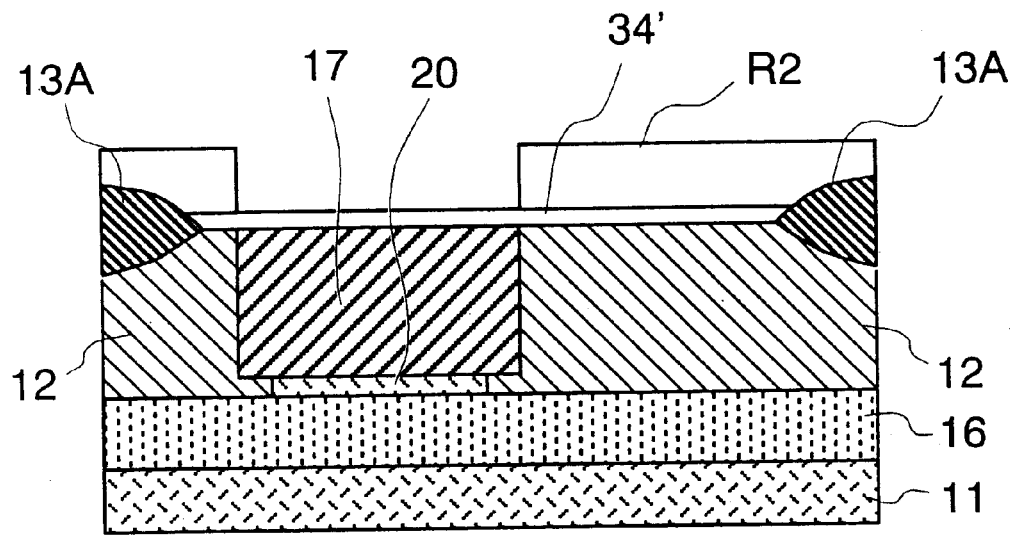
FIGS. 8A and 8B are process diagrams showing a third embodiment of a manufacturing method for a photoelectric conversion device according to the present invention.

Next, as shown in FIG. 8A, in the p-type silicon substrate 11, a region other than the region comprising the n-type impurity layer (reverse depletion layer forming layer) 17 having an outline located outward by a distance W from the outline of the p-type impurity layer (depletion layer forming layer) 20, seen in plan view, is coated with a resist R2, and for example phosphorous (P) ions are implanted at an implantation energy −300 keV and dose amount to form the n-type impurity layer (reverse depletion layer forming layer) 17.

[Process for Forming Light Receiving Region (Photoelectric Conversion Region) 14]

Figure 8B:
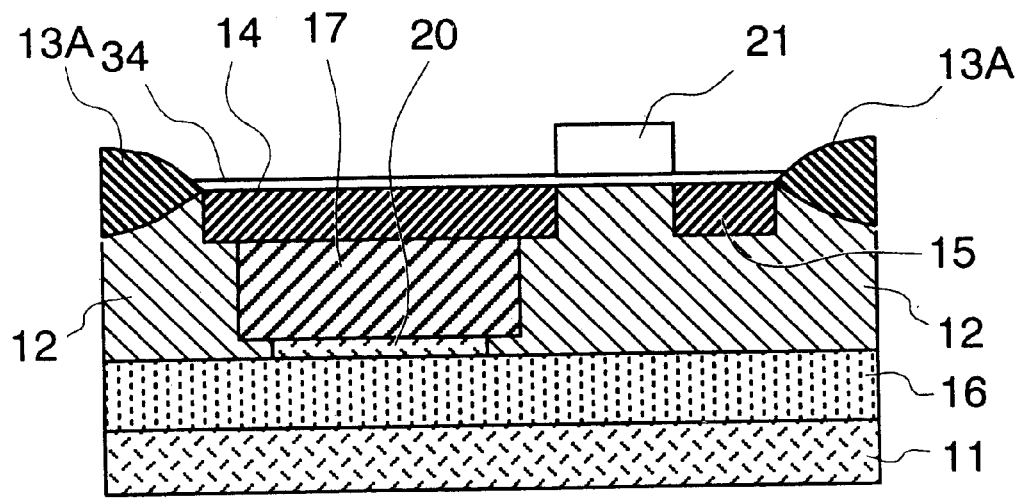

Next, as shown in FIG. 8B, an $SiO_2$ film 34 of around 10 nm thickness is formed, after which a reset gate 21 is formed on the $SiO_2$ film 34. The gate 21 can be formed from a polysilicon, or a polycide comprising a two layer construction of a polysilicon and a W silicide.

Then, the region other than the reset drain region 15 is coated with a resist, and for example arsenic (As) is implanted at an implant energy of 70 keV and dose amount $1\times10^{16}/cm^2$, to form the reset drain region 15 comprising an n+ type region.

Next, a region other than the region comprising the light receiving region 14 having an outline located outward by a distance W from the outline of the n-type impurity layer (reverse depletion layer forming layer) 17, seen in plan view, is coated with a resist, and for example phosphorus (P) ions are implanted at an implantation energy −150 keV and dose amount $1\times10^{13}/cm^2$, to form the light receiving region 14 comprising an n-type region.

After this, an interlayer film, wiring, and a shield film are formed to thereby produce the basic cell as shown in FIG. 6 and FIG. 7.

The present embodiment is a manufacturing method for a photoelectric conversion device where at a position under the light receiving region 14, there is provided an n-type impurity layer (reverse depletion layer forming layer) 17 in which the impurity concentration thereof is set to be lower than that of the light receiving region 14 for enabling a reduction in the coupling capacitance, such that at least a part thereof is located inside of the light receiving region 14, seen in plan view, for enabling extension of the depletion layer, wherein the manufacturing method adopts means having: a step for forming a p-type well layer 12 on the p-type semiconductor substrate 11; a step for forming the light receiving region (photoelectric conversion region) 14 on the p-type well layer 12; and a step for forming the n-type impurity layer (reverse depletion layer forming layer)17 so that at least a part thereof is located inside of the light receiving region 14, seen in plan view. As a result, the coupling capacitance can be reduced, the depletion layer can be extended, the high withstanding voltage characteristics, the transistor characteristics (operating characteristics) and the separation characteristics between pixels can be maintained, the photoelectric conversion efficiency, the power conversion efficiency and the detection sensitivity can be improved. In addition, compared to the CCD sensor which uses a special process to which it is difficult to directly apply the CMOS circuit manufacturing process, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load.

The present embodiment, as with the first embodiment shown in FIG. 1 through FIG. 3 and the second embodiment shown in FIG. 4 through FIG. 5 has: a step for forming the p-type well layer 12 on the p-type semiconductor substrate 11; a step for forming the p-type impurity layer (depletion layer forming layer) 20 having an impurity concentration the same as that of the p-type semiconductor substrate 11, on p-type well layer 12; and a step for forming the light receiving region (photoelectric conversion region) 14 having an outline located outward by a distance W from the outline of the p-type impurity layer (depletion layer forming layer) 20. The step for forming the p-type well layer 12 and the step for forming the p-type impurity layer (depletion layer forming layer) 20 are performed simultaneously. Moreover, this has a step for forming a p-type deep well layer 16 wherein the impurity concentration thereof is set to be lower than that of the p-type well layer 12, or the impurity concentration thereof is set to be higher than that of the p-type semiconductor substrate 11, or the impurity concentration thereof is set to be higher than that of the p-type impurity layer (depletion layer forming layer) 20, and a step for forming an n-type impurity layer (reverse depletion layer forming layer) 17 between the p-type impurity layer (depletion layer forming layer) 20 and the light receiving region 14, having an impurity concentration set to be lower than that of the light receiving region 14, with at least a part thereof located inward of the light receiving region 14, seen in plan view, and at least a part thereof located outward of the p-type impurity layer (depletion layer forming layer) 20, seen in plan view. As a result, the coupling capacitance can be further reduced. Moreover, the depletion layer can be extended, the high withstanding voltage characteristics, the transistor characteristics (operating characteristics) and the separation characteristics between pixels can be maintained. Furthermore, the photoelectric conversion efficiency, the power conversion efficiency and the detection sensitivity can be improved. In addition, compared to the CCD sensor which uses a special process to which it is difficult to directly apply the CMOS circuit manufacturing process, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load. Moreover, the occurrence of leakage (crosstalk) into adjacent pixels of the charge which has been photoelectrically converted, can be prevented by the deep portion of the p-type semiconductor substrate 11.

In the present embodiment, various hardware such as a CPU, a memory, a standard/dedicated macro, an analog circuit and an image sensor portion (H/W integration), and various software such as image compression extensions, speech processing and communication functions (S/W integration) are united on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, the logic circuit portion 106 having a CPU, a memory, a standard/dedicated macro, and an analog circuit, and the image sensor portion 101 can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

Here in the manufacturing method, in the step for forming the logic circuit portion etc. by the CMOS process, it is not necessary to change the established production parameters. Hence the transistor characteristics (operating characteristics) obtained in the past can be maintained. Therefore an SOC can be made for the conditions where the design and characteristics can be obtained by the CMOS process having historical advantages.

Moreover, in this embodiment, in particular photoelectric conversion efficiency due to incident light on the long wavelength red side can be improved.

With the present embodiment, a construction where the p-type deep well layer 16 is not provided is also possible. As a result, the coupling capacitance in the connection portion between the light receiving region 14 and the n-type impurity layer (reverse depletion layer forming layer) 17, and in the connection portion between the n-type impurity layer (reverse depletion layer forming layer) 17 and the p-type semiconductor substrate 11 is reduced, enabling an improvement in the photoelectric conversion efficiency. In this case, the number of production steps can be reduced.

In the present embodiment, it is possible to have the n-type impurity layer (reverse depletion layer forming layer) 17 as a plurality of layers. Here the n-type impurity layer (reverse depletion layer forming layer) 17 may be a plurality of layers, and the impurity concentration of the respective layers may be set to be the same as that of the light receiving region 14 at the layer which contacts the light receiving region 14, and a slope can be set in the impurity concentration of the plurality of layers so that the impurity concentration decreases from this layer on the light receiving region 14 side toward the layer on the deep side of the p-type semiconductor substrate 11. Moreover, the n-type impurity layer (reverse depletion layer forming layer) 17 may comprise a single layer and have a sloping impurity concentration, and the sloping impurity concentration may be set so as to reduce from the light receiving region 14 side having an impurity concentration the same as that of light receiving region 14, toward the deep side of the p-type semiconductor substrate 11.

In this way, in the connection portion between the n-type impurity layer (reverse depletion layer forming layer) 17 and the light receiving region 14, and in the other connection portions such as between the n-type impurity layer (reverse depletion layer forming layer) 17, the p-type impurity layer (depletion layer forming layer) 20 and the p-type deep well layer 16, the coupling capacitance can be further reduced, thus enabling an improvement in the photoelectric conversion efficiency, the power conversion efficiency and the detection sensitivity.

Furthermore, in the present embodiment, it is possible to have the p-type impurity layer (depletion layer forming layer) 20 as a plurality of layers. Here the p-type impurity layer (depletion layer forming layer) 20 may be a plurality of layers, with the impurity concentration of the respective layers set to be the same as that of the p-type deep well layer 16 at the layer which contacts the p-type deep well layer 16, and a slope can be set in the impurity concentration of the plurality of layers so that the impurity concentration decreases from this layer on the p-type deep well layer 16 side toward the layer on the n-type impurity layer (reverse depletion layer forming layer) 17 side. Moreover, the p-type impurity layer (depletion layer forming layer) 20 may comprise a single layer and have a sloping impurity concentration, and the sloping impurity concentration may be set so as to reduce from the p-type deep well layer 16 side having an impurity concentration the same as that of the p-type deep well layer 16, toward the n-type impurity layer (reverse depletion layer forming layer) 17 side.

In this way, in the connection portion between the p-type impurity layer (depletion layer forming layer) 20 and the n-type impurity layer (reverse depletion layer forming layer) 17, and in the connection portion between the p-type impurity layer (depletion layer forming layer) 20 and the p-type deep well layer 16, the coupling capacitance can be further reduced, thus enabling an improvement in the photoelectric conversion efficiency and the detection sensitivity.

Furthermore, by providing the p-type impurity layer (depletion layer forming layer) 20 and the n-type impurity layer (reverse depletion layer forming layer) 17 having a concentration slope as described above, then an even greater junction capacity decrease, and improvement in power conversion efficiency and detection sensitivity becomes possible.

Hereunder is a description based on the drawings, of a fourth embodiment of a photoelectric conversion device and a manufacturing method therefor according to the present invention.

Figure 9A:
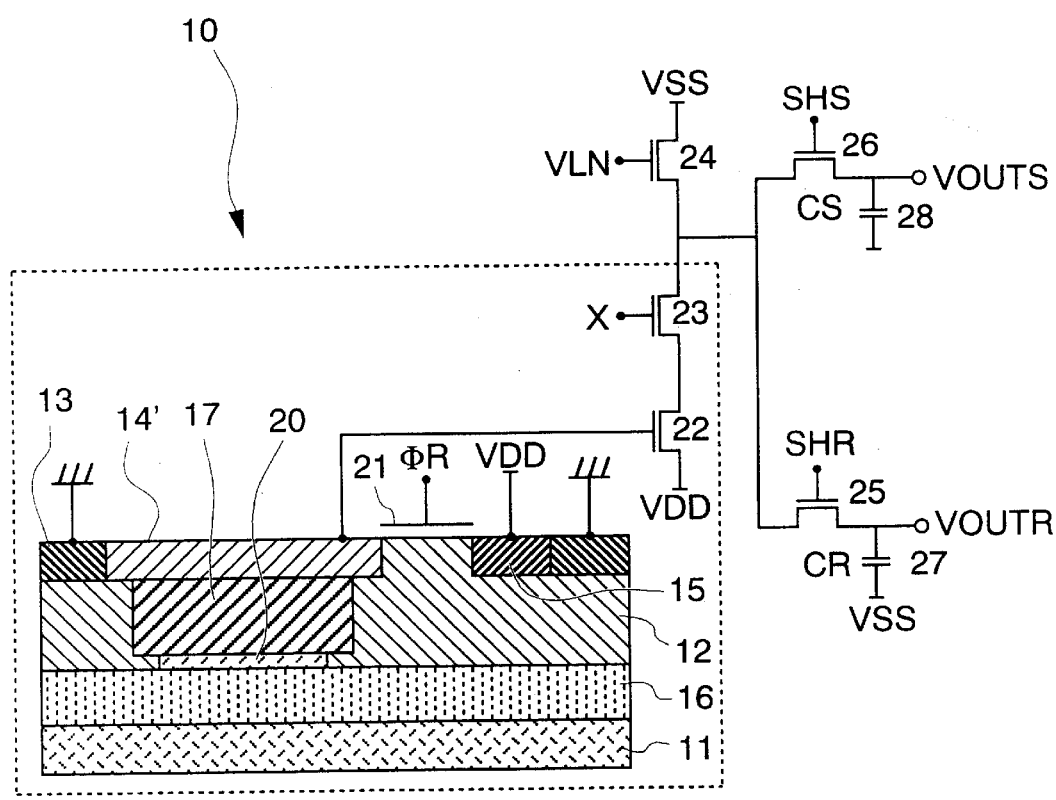
FIGS. 9A and 9B are schematic cross-sectional side views showing a fourth embodiment of a photoelectric conversion device of according to the present invention.
Figure 9B:
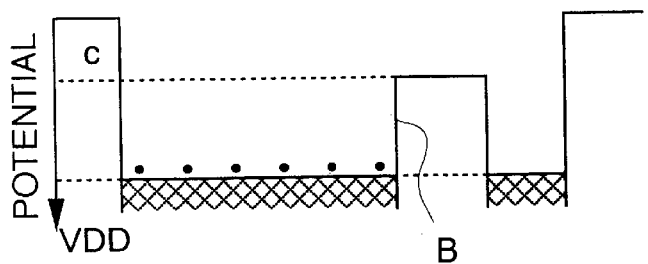
Figure 10A:
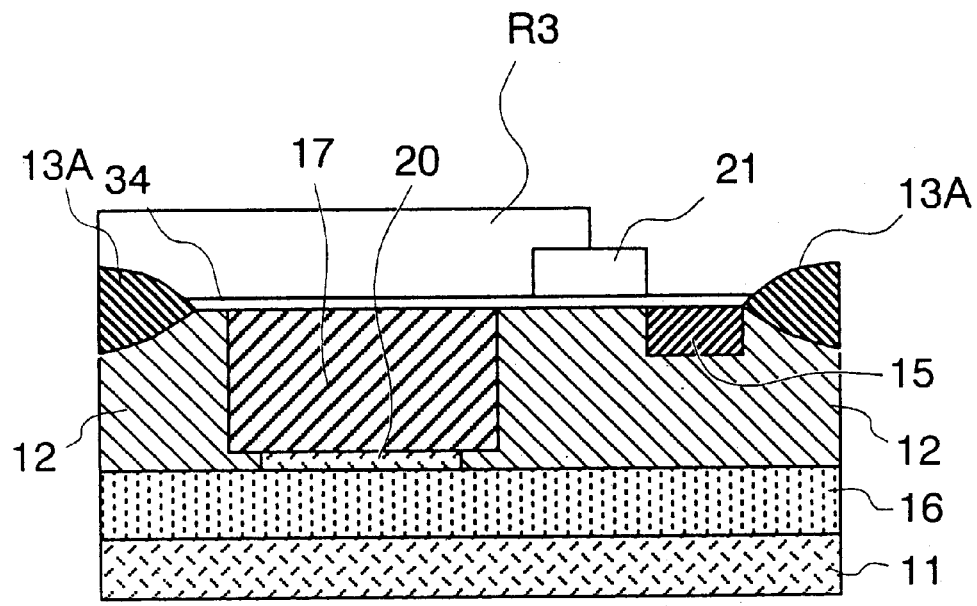
FIGS. 10A and 10B are process diagrams showing a fourth embodiment of a manufacturing method for a photoelectric conversion device according to the present invention.
Figure 10B:
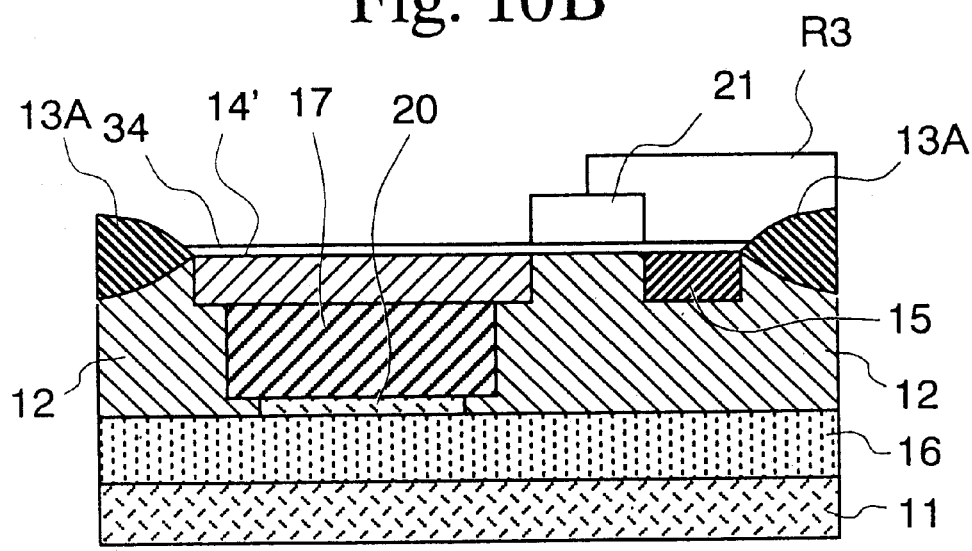

FIG. 9 is a schema in side portion showing a photoelectric conversion device of this embodiment, and FIG. 10 is a process diagram showing a manufacturing method for the photoelectric conversion device in FIG. 9.

With this embodiment, the point which is different to the third embodiment shown in FIG. 6 through FIG. 8, is the point that a light receiving region 14' having an impurity concentration set to be lower than that of the other first conductive type dispersion layer constituting for example a reset drain region 15 is formed. Constituents which are approximately the same as those in the third embodiment shown in FIG. 6 through FIG. 8, are denoted by the same reference symbols.

In this embodiment, results the same as for the first embodiment shown in FIG. 1 through FIG. 3, the second embodiment shown in FIG. 4 through FIG. 5, and the third embodiment shown in FIG. 6 through FIG. 8 are obtained. Moreover, the light receiving region 14' having an impurity concentration set to be lower than that of the other first conductive type dispersion layer constituting for example a reset drain region 15 is formed. As a result, parasitic capacitance can be further reduced, and the photoelectric conversion efficiency, the power conversion efficiency, and the detection sensitivity can be further improved.

At the same time, the light receiving region 14' which is converted into floating diffusion differs from this reset drain region 15, thereby enabling a reduction in image defects generally referred to as "white defects" due to leaks resulting from defects occurring at the time of forming the light receiving region 14'. Hence, the operating characteristics can be improved.

Next is a description of a manufacturing method for a photoelectric conversion device of this embodiment.

In the manufacturing method of this embodiment, manufacture is by the same process as for the manufacturing process of the first embodiment shown in FIG. 3, from FIG. 3A up to FIG. 3B, and manufacture is by the same process as for the manufacturing process of the second embodiment shown in FIG. 5, from FIG. 5A up to FIG. 5B, and manufacture is by the same process as for the manufacturing process of the third embodiment shown in FIG. 8A.

[Process for Forming Light Receiving Region (Photoelectric Conversion Region) 14']

Next, as shown in FIG. 10A, an $SiO_2$ film 34 of around 10 nm thickness is formed, after which a reset gate 21 is formed on the $SiO_2$ film 34. The gate 21 can be formed from a polysilicon, or a polycide comprising a two layer construction of a polysilicon and a W silicide. Then, the region other than the reset drain region 15 is coated with a resist R3, and for example arsenic (As) is implanted at an implant energy of 70 keV and dose amount $1\times10^{16}/cm^2$, to form the reset drain region 15 comprising an n+ type region.

Next, a region other than the region comprising the light receiving region 14' having an outline located outward by a distance W from the outline of the n-type impurity layer (reverse depletion layer forming layer) 17, seen in plan view, is coated with a resist R4, and for example phosphorus (P) ions are implanted at an implantation energy −70 keV and dose amount $1\times10^{14}/cm^2$, to form the light receiving region 14' comprising an n-type region.

After this, an interlayer film, wiring, and a shield film are formed to thereby produce the basic cell as shown in FIG. 9.

The present embodiment has: a step for forming the p-type well layer 12 on the p-type semiconductor substrate 11; a step for forming the p-type impurity layer (depletion layer forming layer) 20 having an impurity concentration the same as that of the p-type semiconductor substrate 11, on p-type well layer 12; and a step for forming the light receiving region (photoelectric conversion region) 14 having an outline located outward by a distance W from the outline of the p-type impurity layer (depletion layer forming layer) 20. The step for forming the p-type well layer 12 and the step for forming the p-type impurity layer (depletion layer forming layer) 20 are performed simultaneously. Moreover, this has a step for forming a p-type deep well layer 16 wherein the impurity concentration thereof is set to be lower than that of the p-type well layer 12, or the impurity concentration thereof is set to be higher than that of the p-type semiconductor substrate 11, or the impurity concentration thereof is set to be higher than that of the p-type impurity layer (depletion layer forming layer) 20, and a step for forming an n-type impurity layer (reverse depletion layer forming layer) 17 between the p-type impurity layer (depletion layer forming layer) 20 and the light receiving region 14, having an impurity concentration set to be lower than that of the light receiving region 14, with at least a part thereof located inward of the light receiving region 14, seen in plan view, and at least a part located thereof outward of the p-type impurity layer (depletion layer forming layer) 20, seen in plan view. As a result, as with the first embodiment shown in FIG. 1 through FIG. 3, the second embodiment shown in FIG. 4 through FIG. 5, and the third embodiment shown in FIG. 6 through FIG. 8, the coupling capacitance can be further reduced. Moreover, the depletion layer can be extended, the high withstanding voltage characteristics, the transistor characteristics (operating characteristics) and the separation characteristics between pixels can be maintained. Furthermore, the photoelectric conversion efficiency, the power conversion efficiency and the detection sensitivity can be improved. In addition, compared to the CCD sensor which uses a special process to which it is difficult to directly apply the CMOS circuit manufacturing process, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load. Moreover, the occurrence of leakage (crosstalk) into adjacent pixels of the charge which has been photoelectrically converted, can be prevented by the deep portion of the p-type semiconductor substrate 11.

Moreover, in the present embodiment, various hardware such as a CPU, a memory, a standard/dedicated macro, an analog circuit and an image sensor portion (H/W integration), and various software such as image compression extensions, speech processing and communication functions (S/W integration) are united on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, the logic circuit portion 106 having a CPU, a memory, a standard/dedicated macro, and an analog circuit, and the image sensor portion 101 can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

Here in the manufacturing method, in the step for forming the logic circuit portion etc. by the CMOS process, it is not necessary to change the established production parameters. Hence the transistor characteristics (operating characteristics) obtained in the past can be maintained. Therefore an SOC can be made for the conditions where the design and characteristics can be obtained by the CMOS process having historical advantages. Moreover, in this embodiment, in particular photoelectric conversion efficiency due to incident light on the long wavelength red side can be improved, and detection sensitivity can be further improved.

Moreover, in this embodiment, parasitic capacitance can be further reduced, and the photoelectric conversion efficiency, the power conversion efficiency, and the detection sensitivity can be further improved.

At the same time, the light receiving region 14' which is converted into floating diffusion differs from this reset drain region 15, thereby enabling a reduction in image defects generally referred to as "white defects" due to leaks resulting from defects occurring at the time of forming the light receiving region 14'. Hence, the operating characteristics can be improved.

Hereunder is a description based on the drawings, of a fifth embodiment of a photoelectric conversion device and a manufacturing method therefor according to the present invention.

Figure 11A:
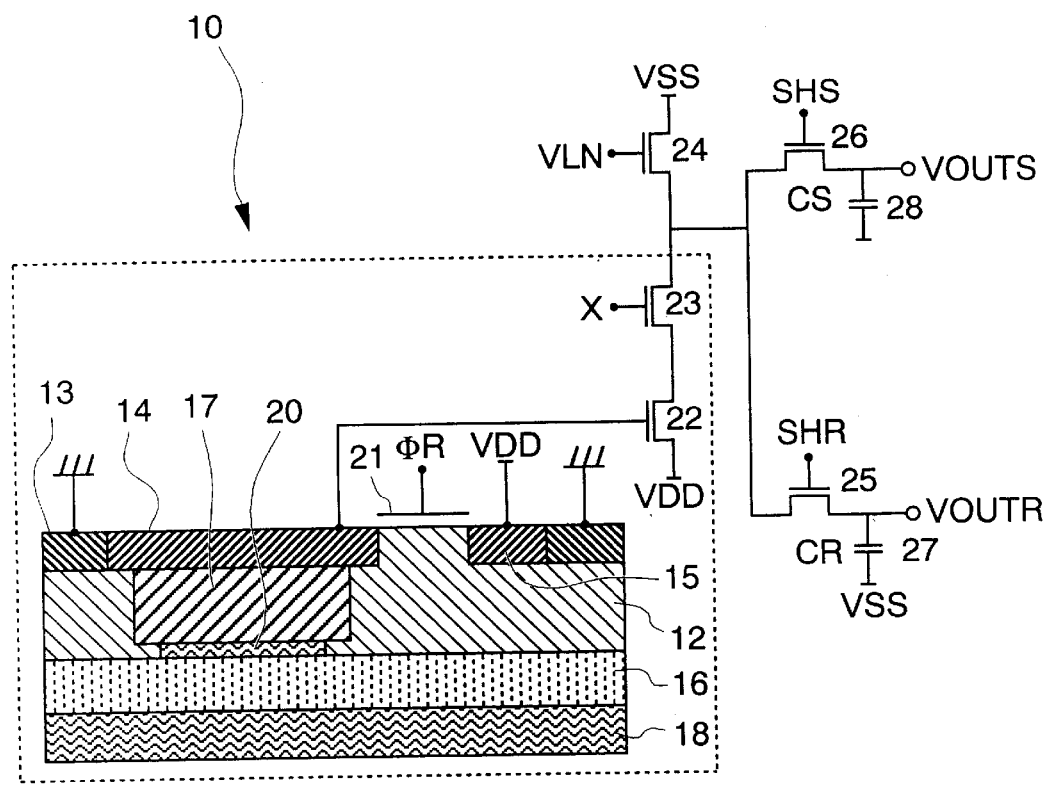
FIGS. 11A and 11B are schematic cross-sectional side view showing a fifth embodiment of a photoelectric conversion device of according to the present invention
Figure 11B:
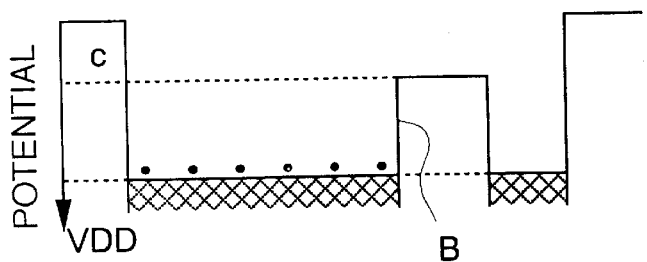

FIG. 11 is a schema in side portion showing a photoelectric conversion device of this embodiment, and FIG. 12 is a process diagram showing a manufacturing method for the photoelectric conversion device in FIG. 3.

In this embodiment, the point which is different to the third embodiment shown in FIG. 6 through FIG. 8, is the point that a semiconductor substrate of an n-type is provided. Constituents which are approximately the same as those in the third embodiment shown in FIG. 6 through FIG. 8, are denoted by the same reference symbols.

This embodiment, as shown in FIG. 11 has a similar construction to that of the third embodiment shown in FIG. 6 through FIG. 8, with a p-type deep well layer 16 provided on an n-type semiconductor substrate 18, and a p-type impurity layer (depletion layer forming layer) 20, an n-type impurity layer (reverse depletion layer forming layer) 17, a light receiving region 14, a p-type well layer 12, and a reset drain region 15 provided on top of this. As a result, as well as demonstrating the same results as for the first embodiment shown in FIG. 1 through FIG. 3, the second embodiment shown in FIG. 4 through FIG. 5, and the third embodiment shown in FIG. 6 through FIG. 8, the floating charges photoelectrically converted by the deep portion of the n-type semiconductor substrate 18 are absorbed by the n-type semiconductor substrate 18 itself, and hence the occurrence of crosstalk between pixels can be reduced.

Next is a description of a manufacturing method for a photoelectric conversion device of the present embodiment.

Figure 12A:
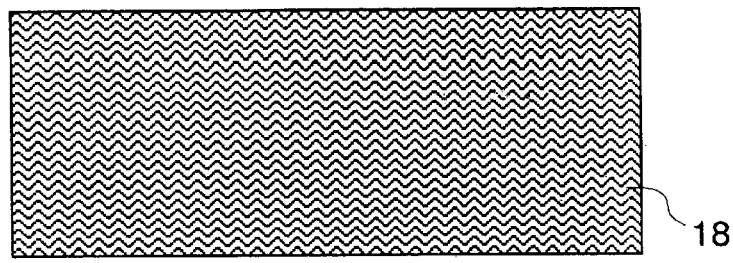
FIGS. 12A to 12D are process diagrams showing a fifth embodiment of a manufacturing method for a photoelectric conversion device according to the present invention.

At first, as shown in FIG. 12A an n-type silicon substrate 18 is prepared.

Figure 12B:
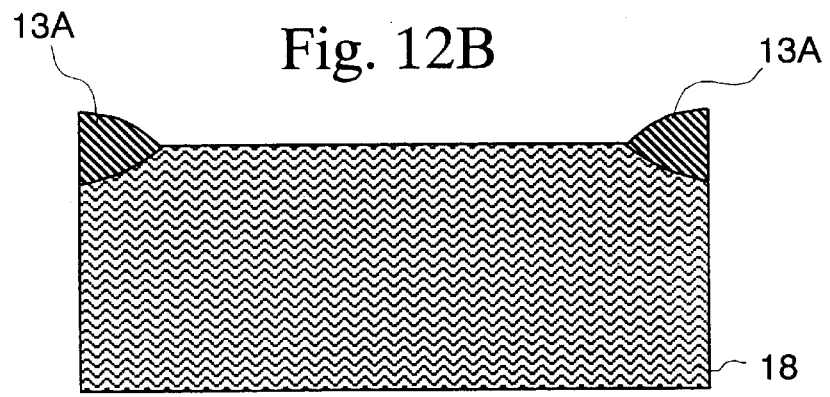

Next, as shown in FIG. 12B, a field oxide film 13A is formed for device separation.

[Process for Forming p-type Deep Well Layer 16]

Figure 12C:
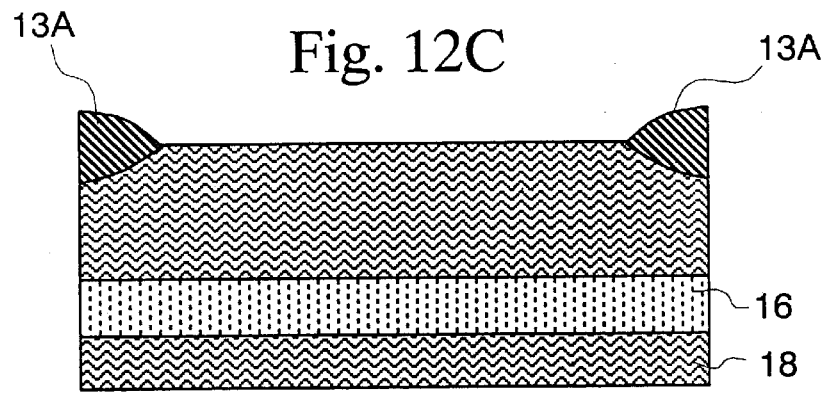

Next, as shown in FIG. 12C, a p-type deep well layer 16 which has been implanted with boron (B) ions is formed over the whole face of the n-type silicon substrate 18. Ion implantation is performed under conditions such as; implantation energy −500 keV and dose amount $5 \times 10^{12}/cm^2$.

[Process for Forming p-type Well Layer 12 and p-type Impurity Layer (Depletion Layer Forming Layer) 20]

Figure 12D:
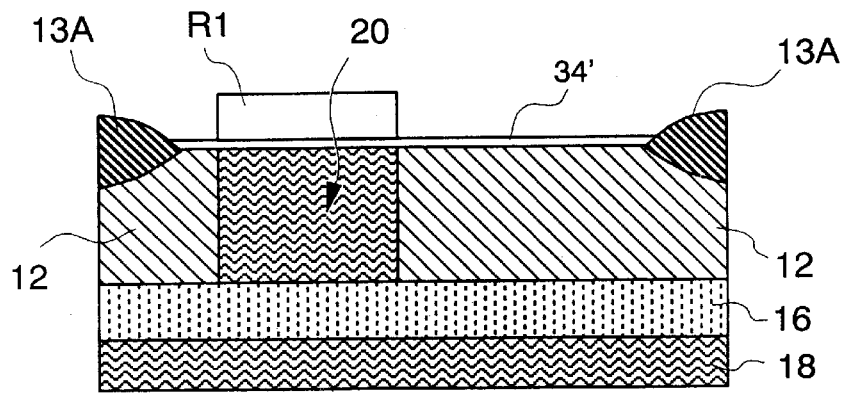

Next, as shown in FIG. 12D, an $SiO_2$ film 34' is formed. Then, boron (B) ions are implanted under conditions; of implantation energy −100 keV and dose amount $1 \times 10^{12}/cm^2$, over the whole face of the n-type silicon substrate 18, to form a p-type impurity layer (depletion layer forming layer) 20. Then a region comprising the p-type impurity layer (depletion layer forming layer) 20 of the n-type silicon substrate 18 is coated with a resist R1, and boron (B) ions are implanted, to form a p-type well layer 12. Ion implantation is performed three times in succession under conditions such as; implantation energy −300 keV, dose amount $1 \times 10^{13}/cm^2$, then 100 keV, $5 \times 10^{12}/cm^2$, and then 60 keV, $2.5 \times 10^{12}/cm^2$.

Next, with the manufacturing method of this embodiment, manufacture is by the same process as for the manufacturing process of the third embodiment shown in FIG. 8, from FIG. 8A to FIG. 8B, to produce the basic cell as shown in FIG. 11.

In this embodiment, both the n-type impurity layer (reverse depletion layer forming layer) 17 and the p-type impurity layer (depletion layer forming layer) 20 are provided. However a construction is also possible where the p-type impurity layer (depletion layer forming layer) 20 is not provided, and as mentioned for the third embodiment, only the n-type impurity layer (reverse depletion layer forming layer) 17 with the impurity concentration set to be lower than that of the light receiving region 14 is provided in contact with the lower side of the light receiving region 14. Hence as well as demonstrating the same results as mentioned for the third embodiment, simplification of the manufacturing process can be achieved.

Moreover, a construction is also possible where the p-type deep well layer 16 is not formed in the n-type semiconductor substrate 18, and as a result an even greater simplification of the manufacturing process can be achieved.

The present embodiment has: a step for forming the p-type well layer 12 on the n-type semiconductor substrate 18; a step for forming the p-type impurity layer (depletion layer forming layer) 20 having an impurity concentration the same as that of the p-type semiconductor substrate 11, on p-type well layer 12; and a step for forming the light receiving region (photoelectric conversion region) 14 having an outline located outward by a distance W from the outline of the p-type impurity layer (depletion layer forming layer) 20, and the step for forming the p-type well layer 12 and the step for forming the p-type impurity layer (depletion layer forming layer) 20 are performed simultaneously. Moreover, this has a step for forming a p-type deep well layer 16 wherein the impurity concentration thereof is set to be higher than that of the p-type impurity layer (depletion layer forming layer) 20, and a step for forming an n-type impurity layer (reverse depletion layer forming layer) 17 between the p-type impurity layer (depletion layer forming layer) 20 and the light receiving region 14, having an impurity concentration set to be lower than that of the light receiving region 14, with at least a part thereof located inward of the light receiving region 14, seen in plan view, and at least a part thereof located outward of the p-type impurity layer (depletion layer forming layer) 20, seen in plan view. As a result, as with the first embodiment shown in FIG. 1 through FIG. 3, the second embodiment shown in FIG. 4 through FIG. 5, and the third embodiment shown in FIG. 6 through FIG. 8, the coupling capacitance can be reduced, the depletion layer can be extended, the high withstanding voltage characteristics, the transistor characteristics (operating characteristics) and the separation characteristics between pixels can be maintained, the photoelectric conversion efficiency, the power conversion efficiency and the detection sensitivity can be improved. In addition, compared to the CCD sensor which uses a special process to which it is difficult to directly apply the CMOS circuit manufacturing process, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load.

In the present embodiment, various hardware such as a CPU, a memory, a standard/dedicated macro, an analog circuit and an image sensor portion (H/W integration), and various software such as image compression extensions, speech processing and communication functions (S/W integration) are united on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, the logic circuit portion 106 having a CPU, a memory, a standard/dedicated macro, and an analog circuit, and the image sensor portion 101 can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

Here in the manufacturing method, in the step for forming the logic circuit portion etc. by the CMOS process, it is not necessary to change the established production parameters. Hence the transistor characteristics (operating characteristics) obtained in the past can be maintained. Therefore an SOC can be made for the conditions where the design and characteristics can be obtained by the CMOS process having historical advantages.

Moreover, in this embodiment, the floating charges photoelectrically converted by the deep portion of the n-type semiconductor substrate 18 are absorbed by the n-type semiconductor substrate 18 itself, and hence the occurrence of crosstalk between pixels can be reduced.

As described above, in the first embodiment shown in FIG. 1 through FIG. 3, the second embodiment shown in FIG. 4 though FIG. 5, the third embodiment shown in FIG. 6 through FIG. 8, the fourth embodiment shown in FIG. 9 through FIG. 10 and the fifth embodiment shown in FIG. 11 through FIG. 12, the photoelectric conversion device is a solid state imaging device comprising a CMOS sensor. However, this can be applied to the case having a logic circuit portion which voltage driven by means of the output from the light receiving portion having a light receiving region, and as mentioned above, the power conversion efficiency can be improved, and an improvement in operability achieved.

Furthermore, apart from this also, this may be applied to a light receiving element having a light receiving portion having a light receiving region, and a logic circuit portion used for control or signal processing etc. in the light receiving portion (photoelectric conversion portion), which is formed by the same process as for the photoelectric conversion portion and the logic circuit portion (CMOS circuit portion) on the semiconductor substrate. As a result, the operability of the light receiving element is improved, and also the photoelectric conversion portion and the logic circuit portion (CMOS circuit portion) can be formed by different processes, or the manufacturing steps can be reduced compared to for a light receiving element produced using a special manufacturing process, and a reduction in process-wise load can be achieved.

Furthermore, this may be applied to a photocoupler comprising the above described light receiving element and a corresponding light emission element. As a result, the operability of the light receiving element is improved, and also the photoelectric conversion portion and the logic circuit portion (CMOS circuit portion) can be formed by different processes, or the manufacturing steps can be reduced compared to for a photocoupler comprising a light receiving element produced using a special manufacturing process, and a reduction in process-wise load can be achieved.

The photoelectric conversion device and the manufacturing method of the same according to the present invention, the following results are obtained.

(1) With the photoelectric conversion device of the present invention, a first conductive type impurity layer (depletion layer forming layer) having an impurity concentration set to be lower than the well layer, is provided at a position under the second conductive type light receiving region, for enabling a reduction in the coupling capacitance. As a result, the coupling capacitance in a connection portion between the second conductive type light receiving region (photoelectric conversion region) and the first conductive type impurity layer (depletion layer forming layer) is reduced to improve the power conversion efficiency. Moreover, by providing the first conductive type impurity layer (depletion layer forming layer) such that at least a part thereof is located inside of the light receiving region, seen in plan view, for enabling extension of the depletion layer, then when the depletion layer is extended toward the semiconductor substrate side, extension of the depletion layer in the outward direction of the second conductive type light receiving region, seen in plan view, can be prevented. Therefore, parasitic capacitance can be reduced, enabling an increase of the potential change due to the signal charge, and an improvement in the photoelectric conversion efficiency. As a result, the detection sensitivity can be improved.

Furthermore, by providing the first conductive type impurity layer (depletion layer forming layer) located inside of the light receiving region, seen in plan view, then when the depletion layer is extended toward the semiconductor substrate deep side, extension of the depletion layer in the outward direction of the light receiving region, seen in plan view, can be prevented. Hence, it becomes possible to improve the power conversion efficiency and photoelectric conversion efficiency, while maintaining the transistor characteristics (operating characteristics) and the device separation characteristics.

By applying the present invention to a solid state imaging device which is an active XY addressing type CMOS sensor wherein a photoelectric conversion region and a logic circuit portion (CMOS circuit portion) are formed on a semiconductor substrate with the same process, and a potential change due to charges generated in the photoelectric conversion region is output, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load, compared to the CCD sensor which uses a special process to which it is difficult to directly apply the CMOS circuit manufacturing process.

By applying the present invention to a light receiving element having a light receiving portion and a logic circuit portion used for control or signal processing in the light receiving portion (photoelectric conversion portion), wherein the photoelectric conversion portion and the logic circuit portion (CMOS circuit portion or the like) are formed on a semiconductor substrate with the same process, the operating characteristics of the light receiving element can be improved. Moreover the manufacturing steps are reduced compared to a light receiving element produced using a special manufacturing process, enabling a reduction in process-wise load.

By applying the present invention to a photocoupler comprising the above described light receiving element and a corresponding light emission element, the operating characteristics of the light receiving element can be improved. Moreover the manufacturing steps are reduced as described above, enabling a reduction in process-wise load.

(2) In the present invention, the first conductive type impurity layer (depletion layer forming layer) has a layer thickness approximately the same as that of the well layer located at a position under the second conductive type light receiving region. Hence the coupling capacitance is reduced in a connection portion between the second conductive type light receiving region and the first conductive type impurity layer (depletion layer forming layer), to improve the power conversion efficiency, as well as enabling extension of the depletion layer toward the deep side of the semiconductor substrate. In addition, while maintaining the transistor characteristics (operating characteristics), the parasitic capacitance can be reduced, enabling an increase in the potential change due to the signal charge, and an improvement in the power conversion efficiency. Moreover, the photoelectric conversion efficiency can be improved. This result enables an improvement in detection sensitivity.

Here, the first conductive type impurity layer (depletion layer forming layer) is connected to the semiconductor substrate being of the first conductive type, or an impurity concentration of the first conductive type impurity layer (depletion layer forming layer) is set to be the same as that of the semiconductor substrate being of the first conductive type. Furthermore, since the first conductive type impurity layer (depletion layer forming layer) is integrated with the semiconductor substrate being of the first conductive type, it is possible to reduce the manufacturing steps, to thereby reduce process-wise load and reduce production costs.

With respect to the present invention, the first conductive type deep well layer is provided on the semiconductor substrate, with an impurity concentration set to be the same as or lower than that of the well layer, and the impurity concentration of the first conductive type deep well layer is set to be higher than that of the semiconductor substrate being of the first conductive type, or higher than that of the first conductive type impurity layer (depletion layer forming layer) in contact with the first conductive type deep well layer. As a result, the coupling capacitance is reduced at the connection portion between the first conductive type deep well layer and the first conductive type impurity layer (depletion layer forming layer), enabling improvement in the power conversion efficiency. That is, crosstalk where floating charges generated in the deep portion of the semiconductor substrate leak into adjacent other pixels can be prevented by the first conductive type deep well layer provided therein.

(3) The present invention has a first conductive type well layer provided on a semiconductor substrate and a second conductive type light receiving region (photoelectric conversion region) provided on the well layer, and at a position under the second conductive type light receiving region, there is provided a second conductive type impurity layer (reverse depletion layer forming layer) such that at least a part thereof is located inside of the light receiving region, seen in plan view. As a result, at the connection portion of the light receiving region and the second conductive type impurity layer (reverse depletion layer forming layer) the coupling capacitance can be reduced and power conversion efficiency improved. Moreover extension of the depletion layer toward the semiconductor substrate deep side is possible, enabling a reduction in the coupling capacitance and an improvement in photoelectric conversion efficiency.

Furthermore, by providing the second conductive type impurity layer (reverse depletion layer forming layer) located inside of the second conductive type light receiving region (photoelectric conversion region), seen in plan view, then when the depletion layer is extended toward the semiconductor substrate deep side, extension of the depletion layer in the outward direction of the light receiving region, seen in plan view, can be prevented. Hence, the photoelectric conversion efficiency can be improved, while maintaining the transistor characteristics (operating characteristics) and the device separation characteristics.

In the present invention, the second conductive type impurity layer (reverse depletion layer forming layer) is located between the first conductive type impurity layer (depletion layer forming layer) and the second conductive type light receiving region, and the total thickness of the second conductive type impurity layer (reverse depletion layer forming layer) and the first conductive type impurity layer (depletion layer forming layer) has approximately the same layer thickness as that of the well layer located at a position under the second conductive type light receiving region. As a result, the coupling capacitance is reduced at the connection portion between the second conductive type impurity layer (reverse depletion layer forming layer) and the first conductive type impurity layer (depletion layer forming layer), enabling improvement in the power conversion efficiency. Moreover, since the second conductive type impurity layer (reverse depletion layer forming layer) is provided such that at least a part of the second conductive type impurity layer is located inside of the second conductive type light receiving region, seen in plan view, and the first conductive type impurity layer (depletion layer forming layer) is provided such that at least a part of the first conductive type impurity layer is located inside of the second conductive type impurity layer (reverse depletion layer forming layer), seen in plan view, then when in each connection portion, the depletion layer is extended toward the side of the semiconductor substrate, extension of the depletion layer in the outward direction of the second conductive type light receiving region, seen in plan view, can be prevented. Moreover, while the transistor characteristics (operating characteristics) and the separation characteristics between pixels are maintained due to the high withstanding voltage characteristics being maintained, the photoelectric conversion efficiency can be improved.

(4) In the present invention, the first conductive type impurity layer (depletion layer forming layer) in contact with the second conductive type light receiving region comprises a plurality of layers, or has a sloping impurity concentration, and the impurity concentration or the sloping impurity concentration of respective layers is set so as to decrease from the semiconductor substrate side toward the second conductive type light receiving region. Hence, the coupling capacitance can be reduced at this connection portion and at other connection portions with the semiconductor substrate or with the first conductive type deep well layer, enabling improvement in the power conversion efficiency. That is, crosstalk where floating charges generated in the deep portion of the semiconductor substrate leak into adjacent other pixels can be prevented by the first conductive type deep well layer provided therein.

Moreover, the first conductive type impurity layer (depletion layer forming layer) in contact with the second conductive type impurity layer (reverse depletion layer forming layer) comprises a plurality of layers or has a sloping impurity concentration, and it is set such that the impurity concentration or the sloping impurity concentration of respective layers decreases from the semiconductor substrate side toward the second conductive type impurity layer (reverse depletion layer forming layer). As a result, the coupling capacitance can be reduced at the connection portion between these and at other connection portions with the semiconductor substrate or with the first conductive type deep well layer, enabling improvement in the photoelectric conversion efficiency.

Furthermore, the second conductive type impurity layer (reverse depletion layer forming layer) in contact with the second conductive type light receiving region comprises a plurality of layers, or has a sloping impurity concentration, and the impurity concentration or the sloping impurity concentration of respective layers is set so as to decrease from the second conductive type light receiving region side toward the semiconductor substrate side. Hence, the coupling capacitance can be reduced at this connection portion and at other connection portions with the first conductive type impurity layer (depletion layer forming layer), enabling improvement in the power conversion efficiency. As a result, maintenance of high withstanding voltage characteristics, and a further improvement in photoelectric conversion efficiency can be achieved.

(5) In the present invention, it is possible to select a technique where the semiconductor substrate is of a first conductive type or of a second conductive type due to the existence of a first conductive type deep well layer. When the semiconductor substrate is of the second conductive type, charges photoelectrically converted in the deep portion of the second conductive type semiconductor substrate can be prevented from flowing into adjacent pixels, thereby reducing the occurrence of crosstalk.

With the present invention, the impurity concentration of the second conductive type light receiving region (photoelectric conversion region) is set to be lower than that of an other first conductive type diffusion layer, thereby enabling a reduction in parasitic capacitance.

At the same time, by setting the impurity concentration of the second conductive type light receiving region to be lower than that of an other second conductive type diffusion layer serving as a reset drain region which is, for example, a drain of the control gate, the second conductive type light receiving region (photoelectric conversion region) which is converted into floating diffusion differs from the other second conductive type diffusion layer. Hence a reduction is possible in image defects generally referred to as "white defects" due to leaks resulting from defects occurring at the time of forming the second conductive type light receiving region (photoelectric conversion region). Therefore the operating characteristics can be improved.

When the present invention has a logic circuit portion which is voltage driven by means of the output from the second conductive type light receiving region (photoelectric conversion region), the power conversion efficiency can be improved as described above, and operating characteristics can be improved.

The present embodiment is composed of various hardware such as a CPU, a memory, a standard/dedicated macro, an analog circuit and an image sensor portion (H/W integration), and various software such as image compression extensions, speech processing and communication functions (S/W integration) on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, a CPU, a memory, a standard/dedicated macro, an analog circuit, and an image sensor portion etc., can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

(6) The present invention is a manufacturing method for a photoelectric conversion device having a first conductive type well layer provided on a semiconductor substrate and a second conductive type light receiving region (photoelectric conversion region) provided on the well layer, and at a position under the light receiving region, there is provided a first conductive type impurity layer (depletion layer forming layer) in which the impurity concentration thereof is set to be lower than that of the well layer for enabling a reduction in the coupling capacitance, such that at least a part of the first conductive type impurity layer is located inside of the light receiving region, seen in plan view, for enabling extension of the depletion layer, wherein the manufacturing method comprises the steps for forming the first conductive type well layer on the semiconductor substrate; a step for forming the second conductive type light receiving region (photoelectric conversion region) on the well layer; and a step for forming the first conductive type impurity layer (depletion layer forming layer). Alternatively, the present invention is a manufacturing method for a photoelectric conversion device having a first conductive type well layer provided on a semiconductor substrate and a second conductive type light receiving region (photoelectric conversion region) provided on the well layer, and at a position under the light receiving region, there is provided a second conductive type impurity layer (reverse depletion layer forming layer) in which the impurity concentration thereof is set to be lower than that of the light receiving region for enabling a reduction in the coupling capacitance, such that at least a part of the second conductive type impurity layer is located inside of the light receiving region, seen in plan view, for enabling extension of the depletion layer, wherein the manufacturing method comprises the steps for forming the first conductive type well layer on the semiconductor substrate; a step for forming the second conductive type light receiving region (photoelectric conversion region) on the well layer; and a step for forming the second conductive type impurity layer (reverse depletion layer forming layer). As a result, the coupling capacitance can be reduced, the depletion layer can be extended, the high withstanding voltage characteristics, the transistor characteristics (operating characteristics) and the separation characteristics between pixels can be maintained, the power conversion efficiency as well as the photoelectric conversion efficiency can be improved, and the detection sensitivity can be improved. In addition, compared to the CCD sensor which uses a special process to which it is difficult to directly apply the CMOS circuit manufacturing process, a CPU, a memory, a standard/dedicated macro, an analog circuit and an image sensor portion can be formed at the same time with the CMOS process, by means of the standard parameters widely used for processors, semiconductor memories such as DRAMs, and logic circuits, enabling a reduction in the manufacturing steps and a reduction in process-wise load.

(7) The present invention can provide a manufacturing method for a photoelectric conversion device, wherein by having a step for forming the first conductive type deep well layer in which the impurity concentration thereof is set to be higher than that of the semiconductor substrate being of the first conductive type, or lower than that of the well layer, or higher than that of the first conductive type impurity layer (depletion layer forming layer), it becomes possible to select the semiconductor substrate being of the first conductive type or the second conductive type. Moreover prevention of the occurrence of crosstalk, a further reduction in coupling capacitance, and maintenance of the high withstanding voltage characteristics can be effected.

The present invention can provide a manufacturing method for a photoelectric conversion device, wherein by having a step for forming the second conductive type impurity layer (reverse depletion layer forming layer) between the first conductive type impurity layer (depletion layer forming layer) and the second conductive type light receiving region, such that the impurity concentration thereof is set to be lower than that of the second conductive type light receiving region, and at least a part thereof is located inside of the second conductive type light receiving region, seen in plan view, and at least a part thereof is located outside of the first conductive type impurity layer (depletion layer forming layer), seen in plan view, a reduction in the coupling capacitance, an improvement in separation characteristics between pixels, and an extension of the depletion layer is made possible, and an improvement in operating characteristics achieved.

The present invention can provide a manufacturing method for a photoelectric conversion device, which can further reduce parasitic capacitance, by having a step for forming the second conductive type light receiving region with an impurity concentration set to be lower than that of an other second conductive type diffusion layer.

At the same time, by setting the impurity concentration of the second conductive type light receiving region to be lower than that of an other second conductive type diffusion layer serving as a reset drain region which is, for example, a drain of the control gate, the second conductive type light receiving region (photoelectric conversion region) which becomes floating diffusion differs from the other second conductive type diffusion layer. Hence a reduction is possible in image defects generally referred to as "white defect" due to leaks resulting from defects occurring at the time of forming the second conductive type light receiving region (photoelectric conversion region).

The present embodiment, which is composed of various hardware such as a CPU, a memory, a standard/dedicated macro, an analog circuit and an image sensor portion (H/W integration), and various software such as image compression extensions, speech processing and communication functions (S/W integration) on one chip, and this is produced as an SOC (System on Chip) in which an LSI unit is a semiconductor including a desired system/device functional operation. Hence, compared to the CCD sensor which uses a special process to which it is difficult to directly apply the CMOS circuit manufacturing process, a CPU, a memory, a standard/dedicated macro, an analog circuit, and an image sensor portion etc., can be formed at the same time, by the CMOS process by means of the standard parameters widely used for processors, semiconductor memories such as DRAMs, and logic circuits, enabling a reduction in the manufacturing steps, a reduction in process-wise load, and a reduction in production costs.

What is claimed is:

1. A photoelectric conversion device having a first conductive type well layer provided on a semiconductor substrate and a second conductive type light receiving region provided on said well layer,
    wherein at a position under said light receiving region, there is provided a first conductive type impurity layer in which an impurity concentration thereof is set to be lower than that of said well layer for enabling a reduction in coupling capacitance, such that at least a part of said first conductive type impurity layer is located inside of said light receiving region, seen in plan view, for enabling extension of a depletion layer.

2. A photoelectric conversion device according to claim 1, wherein said first conductive type impurity layer has a layer thickness approximately the same as that of said well layer located at a position under said light receiving region.

3. A photoelectric conversion device according to claim 1, wherein said first conductive type impurity layer is connected to a semiconductor substrate being of a first conductive type.

4. A photoelectric conversion device according to claim 1, wherein an impurity concentration of said first conductive type impurity layer is set to be the same as that of a semiconductor substrate being of the first conductive type.

5. A photoelectric conversion device according to claim 1, wherein said first conductive type impurity layer is integrated with said semiconductor substrate being of the first conductive type.

6. A photoelectric conversion device having a first conductive type well layer provided on a semiconductor substrate and a second conductive type light receiving region provided on said well layer,
    wherein at a position under said light receiving region, there is provided a second conductive type impurity layer in which an impurity concentration thereof is set to be lower than that of said second conductive type light receiving region for enabling a reduction in coupling capacitance, such that at least a part of said second conductive type impurity layer is located inside of said second conductive type light receiving region, seen in plan view, for enabling extension of a depletion layer.

7. A photoelectric conversion device according to claim 1, wherein an impurity concentration of the first conductive type deep well layer is set higher than that of the semiconductor substrate being of the first conductive type.

8. A photoelectric conversion device according to claim 7, wherein a first conductive type deep well layer is provided in said semiconductor substrate, in contact with a lower side of said first conductive type well layer, and having an impurity concentration set to be the same as or lower than that of said first conductive type well layer.

9. A photoelectric conversion device according to claim 7, wherein an impurity concentration of said first conductive type deep well layer is set to be higher than that of said first conductive type impurity layer in contact with said first conductive type deep well layer.

10. A photoelectric conversion device according to claims 1, wherein a second conductive type impurity layer is provided in contact with a lower side of said second conductive type light receiving region, such that an impurity concentration thereof is set to be lower than that of said second conductive type light receiving region, and at least a part of said second conductive type impurity layer is located inside of said second conductive type light receiving region, seen in plan view.

11. A photoelectric conversion device according to claim 10, wherein said second conductive type impurity layer is located between said first conductive type impurity layer and said second conductive type light receiving region.

12. A photoelectric conversion device according to claim 11, wherein said first conductive type impurity layer is provided such that at least a part thereof is located inside of said second conductive type impurity layer, seen in plan view.

13. A photoelectric conversion device according to claim 11, wherein a total of a thickness of said second conductive type impurity layer and a thickness of said first conductive type impurity layer is set to approximately the same as a thickness of said well layer located at a position under said second conductive type light receiving region.

14. A photoelectric conversion device according to claim 1, wherein said first conductive type impurity layer comprises a plurality of layers.

15. A photoelectric conversion device according to claim 14, wherein an impurity concentration of said first conductive type impurity layer is set so as to decrease from a deep side of said semiconductor substrate toward said second conductive type light receiving region.

16. A photoelectric conversion device according to claim 1, wherein said first conductive type impurity layer has a sloping impurity concentration, and a slope of this impurity concentration is set so as to decrease from a deep side of said semiconductor substrate toward said second conductive type light receiving region side.

17. A photoelectric conversion device according to claim 6, wherein said second conductive type impurity layer comprises a plurality of layers.

18. A photoelectric conversion device according to claim 17, wherein an impurity concentration of said plurality of second conductive type impurity layers is set so as to decrease from said second conductive type light receiving region side toward a deep side of said semiconductor substrate.

19. A photoelectric conversion device according to claim 6, wherein said second conductive type impurity layer has a sloping impurity concentration, and a slope of this impurity concentration is set so as to decrease from said second conductive type light receiving region side toward a deep side of said semiconductor substrate.

20. A photoelectric conversion device according to claim 1, wherein said semiconductor substrate is of a second conductive type.

21. A photoelectric conversion device according to claim 1, wherein an impurity concentration of said second conductive type light receiving region is set to be lower than an impurity concentration of an other second conductive type diffusion layer.

22. A photoelectric conversion device according to 1, having a logic circuit portion which is voltage driven by means of an output from said second conductive type light receiving region.

23. A photoelectric conversion device according to claim 1, being a system on chip device.

24. A photoelectric conversion device according to claim 1, being an active XY addressing type solid state imaging device where a photoelectric conversion portion and a logic circuit portion are formed on a semiconductor substrate with the same process, and a potential change due to charges generated in said photoelectric conversion portion is output.

25. A photoelectric conversion device according to claim 24, being a CMOS sensor.

26. A photoelectric conversion device according to claim 1, being a light receiving element having a light receiving portion having a light receiving region, and a logic circuit portion used for control or signal processing in said light receiving portion.

27. A photoelectric conversion device according to claim 26, being a photocoupler comprising said light receiving element and a corresponding light emission element.

28. A manufacturing method for a photoelectric conversion device having a first conductive type well layer provided on a semiconductor substrate and a second conductive type light receiving region provided on said well layer, and at a position under said second conductive type light receiving region, there is provided a first conductive type impurity layer in which an impurity concentration thereof is set to be lower than that of said well layer for enabling a reduction in coupling capacitance, such that at least a part of said first conductive type impurity layer is located inside of said second conductive type light receiving region, seen in plan view, for enabling extension of a depletion layer, said manufacturing method comprising:

a step for forming said first conductive type well layer on said semiconductor substrate;

a step for forming said second conductive type light receiving region on said well layer; and a step for forming said first conductive type impurity layer.

29. A manufacturing method for a photoelectric conversion device having a first conductive type well layer provided on a semiconductor substrate, and a second conductive type light receiving region provided on said well layer, and at a position under said second conductive type light receiving region, there is provided a second conductive type impurity layer in which an impurity concentration thereof is set to be lower than that of said second conductive type light receiving region for enabling a reduction in coupling capacitance, such that at least a part of said second conductive type impurity layer is located inside of said second conductive type light receiving region, seen in plan view, for enabling extension of a depletion layer, said manufacturing method comprising:

a step for forming said first conductive type well layer on said semiconductor substrate;

a step for forming said second conductive type light receiving region on said well layer; and a step for forming said second conductive type impurity layer (reverse depletion layer forming layer).

30. A manufacturing method for a photoelectric conversion device according to claim 28, having a step for forming a first conductive type deep well layer wherein an impurity concentration thereof is set to be higher than that of a semiconductor substrate being of a first conductive type.

31. A manufacturing method for a photoelectric conversion device according to claim 28, having a step for forming a first conductive type deep well layer wherein an impurity concentration thereof is set to be lower than that of said well layer.

32. A manufacturing method for a photoelectric conversion device according to claim 28, having a step for forming a first conductive type deep well layer wherein an impurity concentration thereof is set to be higher than that of said first conductive type impurity layer.

33. A manufacturing method for a photoelectric conversion device according to claim 28, having a step for forming a second conductive type impurity layer between said first conductive type impurity layer and said second conductive type light receiving region, such that an impurity concentration thereof is set to be lower than that of said second conductive type light receiving region, and at least a part thereof is located inside of said second conductive type light receiving region, seen in plan view, and at least a part thereof is located outside of said first conductive type impurity layer, seen in plan view.

34. A manufacturing method for a photoelectric conversion device according to claim 28, having a step for forming said second conductive type light receiving region with an impurity concentration thereof set to be lower than that of an other second conductive type diffusion layer.

35. A manufacturing method for a photoelectric conversion device according to claim 28, being a system on chip.

* * * * *